US012801967B2

(12) United States Patent
Aonishi et al.

(10) Patent No.: US 12,801,967 B2
(45) Date of Patent: Nov. 17, 2026

(54) L0 REGULARIZATION-BASED COMPRESSED SENSING SYSTEM AND METHOD WITH COHERENT ISING MACHINES

(71) Applicants: NTT RESEARCH, INC., Sunnyvale, CA (US); TOKYO INSTITUTE OF TECHNOLOGY, Tokyo (JP)

(72) Inventors: Toru Aonishi, Tokyo (JP); Kazushi Mimura, Tokyo (JP); Masato Okada, Tokyo (JP); Yoshihisa Yamamoto, Sunnyvale, CA (US)

(73) Assignees: NTT RESEARCH, INC., Sunnyvale, CA (US); TOKYO INSTITUTE OF TECHNOLOGY, Tokyo (JP)

( * ) Notice: Subject to any disclaimer, the term of this patent is extended or adjusted under 35 U.S.C. 154(b) by 553 days.

(21) Appl. No.: 18/276,901

(22) PCT Filed: Feb. 17, 2022

(86) PCT No.: PCT/US2022/016861
§ 371 (c)(1),
(2) Date: Aug. 11, 2023

(87) PCT Pub. No.: WO2022/178173
PCT Pub. Date: Aug. 25, 2022

(65) Prior Publication Data

US 2024/0133987 A1 Apr. 25, 2024

Related U.S. Application Data

(60) Provisional application No. 63/151,441, filed on Feb. 19, 2021.

(51) Int. Cl.
*G06N 10/60* (2022.01)
*G01R 33/48* (2006.01)
(Continued)

(52) U.S. Cl.
CPC ......... *G06N 10/60* (2022.01); *G01R 33/4818* (2013.01); *G01R 33/5608* (2013.01); *G06N 10/40* (2022.01); *G06N 20/10* (2019.01)

(58) Field of Classification Search
USPC .......................................................... 702/189
See application file for complete search history.

(56) References Cited

U.S. PATENT DOCUMENTS 10,140,580 B2 * 11/2018 Utsunomiya ............ G06N 5/02
11,604,644 B1 * 3/2023 Rubin .................... G06N 10/80
(Continued)

FOREIGN PATENT DOCUMENTS

JP 2020095397 A 6/2020
JP 2020168352 A 10/2020
(Continued)

OTHER PUBLICATIONS

Nakanishi, K.M., et al., "Sequential minimal optimization for quantum-classical hybrid algorithms." Physical Review Research 2 [online], 043158 Oct. 29, 2020 (Oct. 29, 2020) [online] <httpe://Journals.aps.org/prresearch/pdf/10.1103/PhysRevResearch.2.043158> <DOI: 10.1103/PhysRevResearch.2.043158>.
(Continued)

*Primary Examiner* — Paul D Lee
(74) *Attorney, Agent, or Firm* — DLA Piper LLP US

(57) ABSTRACT

A system and method for L0 regularization-based compressed sensing (CS) may use a quantum-classical hybrid system consisting of coherent Ising machines (CIM) and classical digital processors CDP). The CIM and CDP each performs alternating minimization for L0 regularization-based compressed sensing (CS). A truncated Wigner stochastic differential equation (W-SDE) is obtained from the master equation for the density operator of the network of degenerate optical parametric oscillators.

17 Claims, 15 Drawing Sheets

(51) Int. Cl.

| | |
|---|---|
| ***G01R 33/56*** | (2006.01) |
| ***G06N 10/40*** | (2022.01) |
| *G06N 20/10* | (2019.01) |

(56) References Cited

U.S. PATENT DOCUMENTS

| | | | | |
|---|---|---|---|---|
| 2015/0006443 | A1 | 1/2015 | Rose et al. | |
| 2018/0321347 | A1* | 11/2018 | Wang | G01R 33/5608 |
| 2019/0096659 | A1 | 3/2019 | Xu et al. | |
| 2020/0020933 | A1 | 1/2020 | Ito et al. | |
| 2020/0184375 | A1* | 6/2020 | Ohwa | G06N 5/01 |
| 2020/0209330 | A1 | 7/2020 | Popescu | |
| 2020/0311878 | A1* | 10/2020 | Matsuura | G06T 5/70 |
| 2022/0164693 | A1* | 5/2022 | Tezak | G06N 10/80 |
| 2023/0229727 | A1* | 7/2023 | Ignjatovic | G06F 17/11 708/446 |
| 2023/0418896 | A1* | 12/2023 | Elfving | G06N 10/20 |

FOREIGN PATENT DOCUMENTS

| | | | |
|---|---|---|---|
| WO | 2015156126 | A1 | 10/2015 |
| WO | 2018235568 | A1 | 12/2018 |
| WO | 2019241879 | A1 | 12/2019 |

OTHER PUBLICATIONS

International Search Report and Written Opinion of the International Searching Authority issued in International Application No. PCT/US2022/016861, 11 pages, dated Jul. 19, 2022.

International Preliminary Report on Patentability for International Application No. PCT/US2022/016861, mailed Aug. 31, 2023, 9 Pages.

Office Action for Japanese Patent Application No. 2023-550034, mailed Nov. 28, 2024, 5 pages.

* cited by examiner

Algorithm 1 Alternating minimization of CIM-L0-regularization-based CS

Require: $M$-by-$N$ observation matrix: $A$, $M$-dimensional observation signal: $y$

Ensure: $N$-dimensional support vector: $\sigma$, $N$-dimensional signal vector: $r$ Initialize $r$ and $\eta = \eta_{init}$ for t=1 to 50 do

Minimize $H$ with respect to $\sigma$ by CIM:

$$\sigma = \text{CIM\_support\_estimation}(r, \eta)$$

Initialize the c-amplitude as $c = 0$, and numerically integrate the W-SDE while increasing normalized pump rate from 0 to 1.5 for five times photon's lifetime when $A_s^2 = 10^7$ or for two hundred times photon's lifetime when $A_s^2 = 250$.

Minimize $H$ with respect to $r$ by CDP:

$$S = \text{diag}(\sigma)$$

$$r = \left(\text{diag}[A^T A] + SA^T AS - \text{diag}[SA^T AS]\right)^{-1} SA^T y$$

Decrement $\eta$: $\eta = \max(\eta_{init}(1-t/50), \eta_{end})$ end for

FIGURE10

L0 REGULARIZATION-BASED COMPRESSED SENSING SYSTEM AND METHOD WITH COHERENT ISING MACHINES

CROSS REFERENCE

This application is a 371 of International Application No. PCT/US2022/016861, filed Feb. 17, 2022, which claims priority to U.S. Provisional Application 63/151,441 filed on 19 Feb. 2021, the entirety entireties of which are incorporated herein by reference.

APPENDIX

Appendix A (7 pages) contain supplemental material and figures that form part of the specification and are incorporated herein by reference.

Appendix B (10 pages) lists the method used for various calculations in the specification and this appendix forms part of the specification and are incorporated herein by reference.

FIELD

The disclosure relates to a system and method for compressing sensing that uses a coherent Ising machine.

BACKGROUND

Currently, various techniques exist for performing simulations and optimization processes using quantum devices or machines. These quantum devices or machines are very complicated and difficult/expensive to build. Examples of the quantum machines include Google's and IBM's quantum computers and D-WAVE's quantum annealer. These quantum machines are all very costly and difficult to build and operate.

The least absolute shrinkage and selection operator (LASSO) is a very efficient approach to solving various sparse signal reconstruction problems in exploration geophysics magnetic resonance imaging, black hole observation and material informatics. The LASSO operator is formulated as:

$$x = \underset{x\in\mathbb{R}^N}{\operatorname{argmin}}\left(\frac{1}{2}\|y - Ax\|_2^2 + \lambda\|x\|_1\right) \tag{1}$$

where x is an N-dimensional source signal, y is an M-dimensional observation signal, A is an M-by-N observation matrix, and A is a regularization parameter.

L1 regularization-based compressed sensing (CS) including LASSO can be formulated as a convex optimization problem, for which many efficient heuristic algorithms are available. Equation (1) above is asymptotically equal to L1 minimization-based CS (minimize $\|x\|_1$ s.t. y=Ax) in the limit $\lambda\rightarrow+0$, and thus in this limit LASSO can reconstruct a sparse source signal with infinitesimal errors as long as the ratio of the number of non-zero elements of x to N, i.e. a sparseness a is below a critical value $a_c$, where $a_c$ is less than a measurement compression ratio $\alpha$ defined as $\alpha$=M/N.

On the other hand, L0 regularization-based CS can be formulated with the following L0 norm instead of L1 norm:

$$x = \underset{x\in\mathbb{R}^N}{\operatorname{argmin}}\left(\frac{1}{2}\|y - Ax\|_2^2 + \lambda\|x\|_0\right) \tag{2}$$

It has been suggested that L0 regularization-based CS might outperform L1 regularization-based CS. This is because L1 regularization imposes a shrinkage on variables over a threshold (soft-thresholding) but L0 regularization does not impose such a shrinkage (hard-thresholding). Furthermore, Eq. (2) is asymptotically equal to L0 minimization-based CS (minimize $\|x\|_0$ s.t. y=Ax) in the limit $\lambda\rightarrow+0$ and thus in this limit L0 regularization-based CS can be expected to reconstruct x with infinitesimal errors as long as a is below a critical value $a_c=\alpha$. Note that it is impossible for any system to go beyond the performance limit, because the number of non-zero elements of x is the effective rank of a system of linear equations and thus the system does not have a single unique solution when a>$\alpha$.

L0 regularization-based CS defined in Eq. (2) can be equivalently reformulated as a two-fold optimization problem:

$$(r, \sigma) = \underset{\sigma\in\{0,1\}^N}{\operatorname{argmin}}\,\underset{r\in\mathbb{R}^N}{\operatorname{argmin}}\left(\frac{1}{2}\|y - A(\sigma\circ r)\|_2^2 + \lambda\|\sigma\|_0\right) \tag{3}$$

Here, the element $r_i$ in r represents the real number value of the i-th element in the N-dimensional source signal. The vector $\sigma$ is called a support vector, which represents the places of non-zero elements in the N-dimensional source signal. The element $\sigma_i$ in a takes either 0 or 1 to indicate whether the i-th element in the source signal is zero or non-zero. The symbol $\circ$ denotes the Hadamard product. From the elementwise representation of Eq. (3), the Hamiltonian (H or cost function) of L0 regularization-based CS is given as:

$$H = \sum_{i>j}^{N}\sum_{\mu=1}^{M} A_i^\mu A_j^\mu r_i r_j \sigma_i \sigma_j - \sum_{i=1}^{N}\sum_{\mu=1}^{M} y^\mu A_i^\mu r_i \sigma_i + \lambda\sum_{i=1}^{N}|\sigma_i|_0 \tag{4}$$

where $$A_i^\mu$$

is an element in a M-by-N observation matrix A, and $y^\mu$ is an element in a M-dimensional observation signal.

Under the assumption that the number of 1s of the support vector $\sigma$ is equal to or less than M, the set of simultaneous linear equations obtained from Eq. (3) with respect to r gives the solution for the non-zero elements in the source signal if the support vector $\sigma$ is given. On the other hand, minimization of H with respect to $\sigma$ is identical to minimizing an Ising Hamiltonian if r is given. Because the mutual interaction $$J_{ij} = -\sum\nolimits_{\mu=1}^{M} A_i^\mu A_j^\mu r_i$$

induces frustration among the spins $\sigma_i$, the Hamiltonian might have numerous local minima. Thus, L0 regularization-based CS cannot be formulated as a convex optimization.

It is desirable to provide a system and method for performing L0 regularization-based compressed sensing without the difficult of estimating the support vector and it is to this end that the disclosure is directed.

SUMMARY

Systems and methods here may be used for L0 regularization-based compressed sensing that uses a quantum-classical hybrid system composed of a quantum machine and classical digital processors (CDPs).

In an embodiment, a hybrid system for L0 regularization-based compressed sensing of a source signal is provided. The system may include a quantum machine configured to optimize a first parameter, associated with the source signal, to minimize a cost function; and a classical machine configured to optimize a second parameter, associated with the source signal, to minimize the cost function.

In another embodiment, a method of L0 regularization-based compressed sensing of a source signal may be provided. The method may include optimizing, by a quantum machine, first parameter, associated with the source signal, to minimize a cost function; and optimizing, by classical machine, a second parameter, associated with the source signal, to minimize the cost function.

In yet another embodiment, a method of performing an L0 regularization-based compressed sensing may be provided. The method may include injecting a plurality of pump pulses into a coherent ising machine optical parametric oscillator with an optical parametric oscillator formed in a fiber ring cavity having an output coupler and an input coupler, the output coupler in communication with a homodyne detection output and a second harmonic generation (SHG) crystal.

BRIEF DESCRIPTION OF THE DRAWINGS

FIGS. 9A-9B and 10 are a flowchart and more detailed pseudocode of a method for L0 regularization-based compressed sensing.

DETAILED DESCRIPTION OF ONE OR MORE EMBODIMENTS

The disclosure is particularly applicable to a system and method for L0 regularization-based compressed sensing that uses a quantum-classical hybrid system composed of a quantum machine and classical digital processors (CDPs). The coherent Ising machine (CIM) is a suitable quantum machine for this system because this optimization problem can only be solved with a densely connected network. It is in this context that the disclosure will be described. It will be appreciated, however, that system and method can be implemented in other manners. Furthermore, although the exemplary data is medical data, the system and method for L0 regularization-based compressed sensing may be used for any type of data and it is not limited to any particular type of data.

Figure 1A:
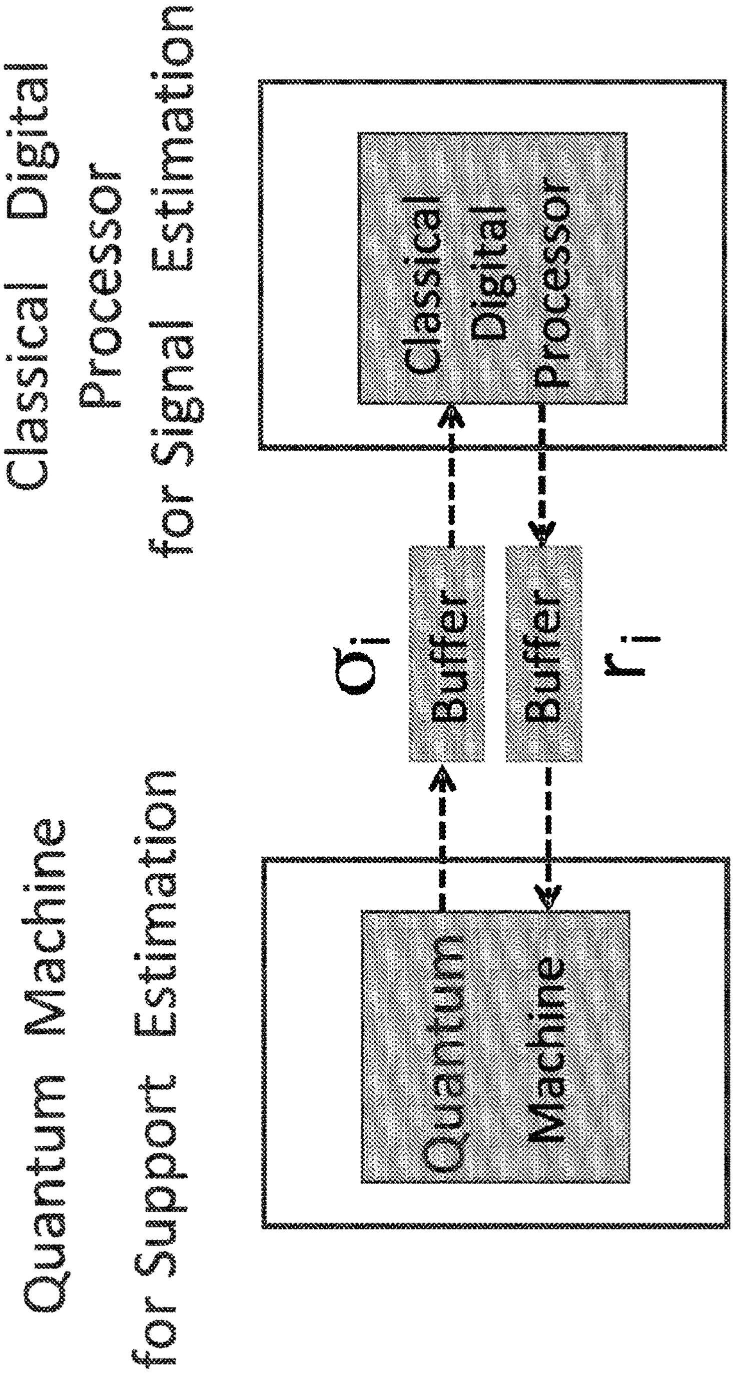
FIG. 1A illustrates a general quantum-classical hybrid system composed of a quantum machine and classical digital processors (CDPs) that can implement the L0 regularization-based compressed sensing.

In the system and method for L0 regularization-based compressed sensing, the technical problem of the difficulty of estimating the support vector as described above is addressed by a technical solution that is a hybrid system that has a quantum machine and CDPs. FIG. 1A shows a quantum-classical hybrid system composed of coherent Ising machine (CIM) and CDPs that can implement the L0 regularization-based compressed sensing. This system solves the two-fold optimization problem by alternately performing two minimization processes; (i) the quantum machine optimizes $\sigma$ to minimize H under the condition that r is fixed, and (ii) the CDP optimizes r to minimize H under the condition that $\sigma$ is fixed.

Several quantum machines can potentially be used for optimizing $\sigma$, such as quantum annealers, quantum approximate optimization algorithm, CIM, and so on. A comparison of these candidates reveals that a measurement-feedback (MFB) CIM is one of most suitable machines for this purpose. In fact, an MFB-CIM can construct any densely connected network composed of degenerate optical parametric oscillators (OPOs) because it uses a time-division multiplexing scheme and MFB. In contrast, QA and almost all other machines can only support local graphs, including chimera graphs, and thus, a densely-connected network for optimizing—has to be embedded in a fixed hardware local graph by using the Lechner-Hauke-Zoller scheme, which requires additional physical spins. Furthermore, it has been reported that a MFB CIM experimentally outperformed a quantum annealer on two problem sets: one is the full-connected Sherrington-Kirkpatrick model and the other is dense graph MAX-CUT. In contrast to the exponential computation time proportional to exp $(O(N^2))$ for the quantum annealer, the CIM has an exponential computational time proportional to exp $(O(\sqrt{N}))$, where N is a problem size.

Figure 1B:
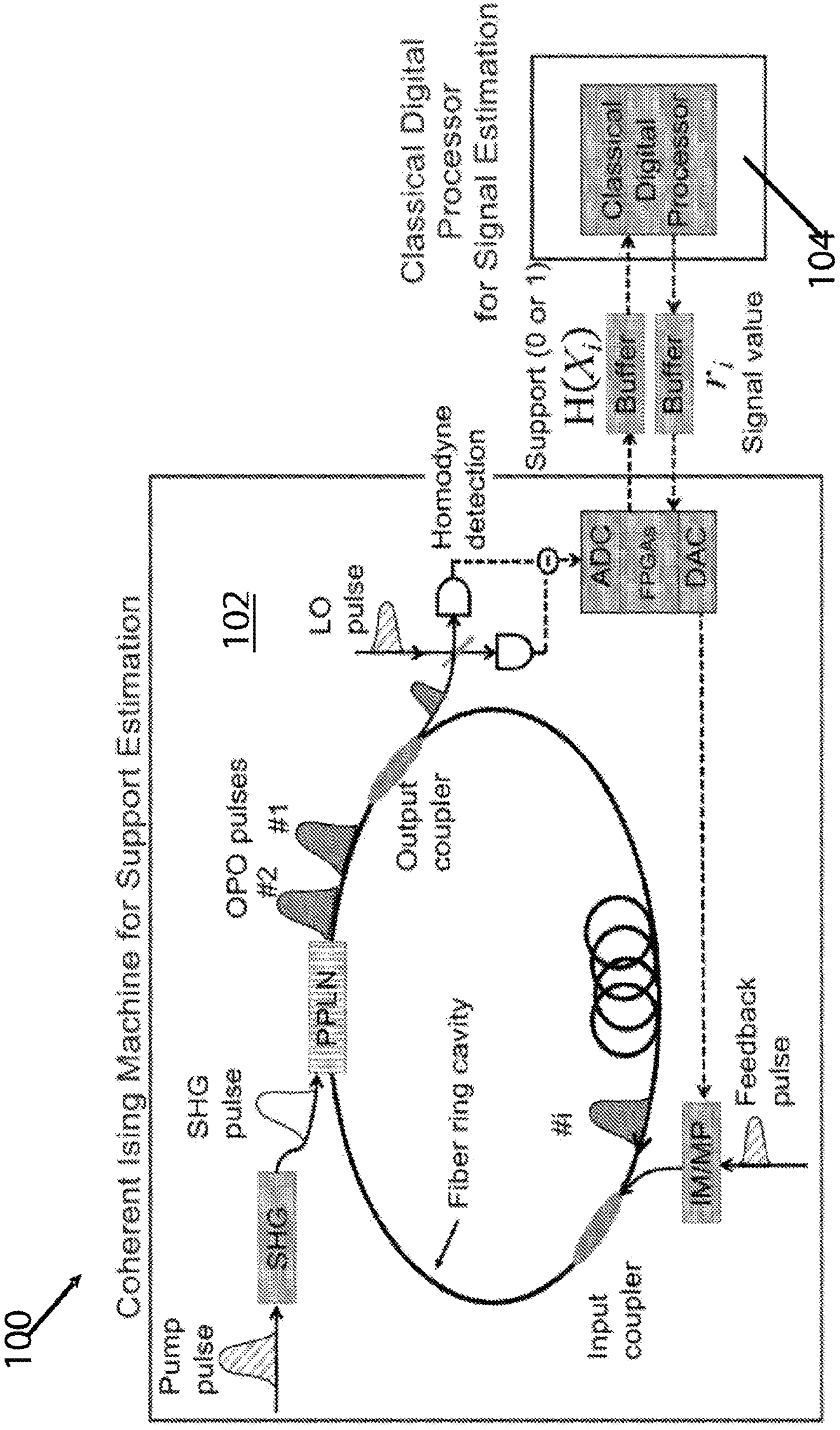
FIG. 1B illustrates a quantum-classical hybrid system composed of coherent Ising machine (CIM) and CDPs that can implement the L0 regularization-based compressed sensing.

FIG. 1B shows the L0 regularization-based compressed sensing system and method may be implemented, in one embodiment, using a quantum-classical hybrid system 100 composed of a CIM 102 and classical digital processors (CDPs) 104. This system 100 alternately performs two minimization processes; (i) the CIM 102 optimizes to minimize the Hamiltonian cost function H with given real number value of the source signal, r, and (ii) the CDP 104 optimizes r to minimize H with a given support vector $\sigma$. Using the system, a truncated Wigner stochastic differential equation (W-SDE) from the master equation for a density operator of network consisting of OPOs. The system and method implements a statistical mechanics method based on self-consistent signal-to-noise analysis (SCSNA) and from which can be derived macroscopic equations for the whole system. As discussed below in detail, the performance of the disclosed system and method approaches the theoretical limit of L0 minimization-based compressed sensing (CS) and possibly exceeds that of the known LASSO technique.

In more detail as shown in FIG. 1B, the CIM 102 of the system 100 has pump pulses that are injected into an optical parametric oscillator (OPO) formed in a fiber ring cavity through second harmonic generation (SHG) crystal. A periodically poled lithium niobate (PPLN) waveguide device induces a phase-sensitive degenerate optical parametric amplification of the signal pulses, and each of the OPO pulses take either the 0-phase state (corresponding to the up-spin) or the a-phase state (corresponding to the down-spin) above the oscillation threshold. A part of each pulse is picked off from the main cavity by the output coupler, and it is measured by optical homodyne detectors. A field programmable gate array (FPGA) calculates the feedback signal which is then provided to the intensity modulator (IM) and phase modulator (PM) to produce the injection field described in Eq. (5) below to each of the OPO pulses through the input coupler. $H(X_i)$ is a binarized value, either 0 or 1, of the in-phase amplitude of the i-th OPO pulse, which is the support estimate to be transferred to the CDP 104. The CDP 104 solves the linear simultaneous equation (Eq. (7) as discussed below), and the solution $r_i$ is transferred to the CIM 102 as shown in FIG. 1B.

Roles of CIM and CDP

Figure 9A:
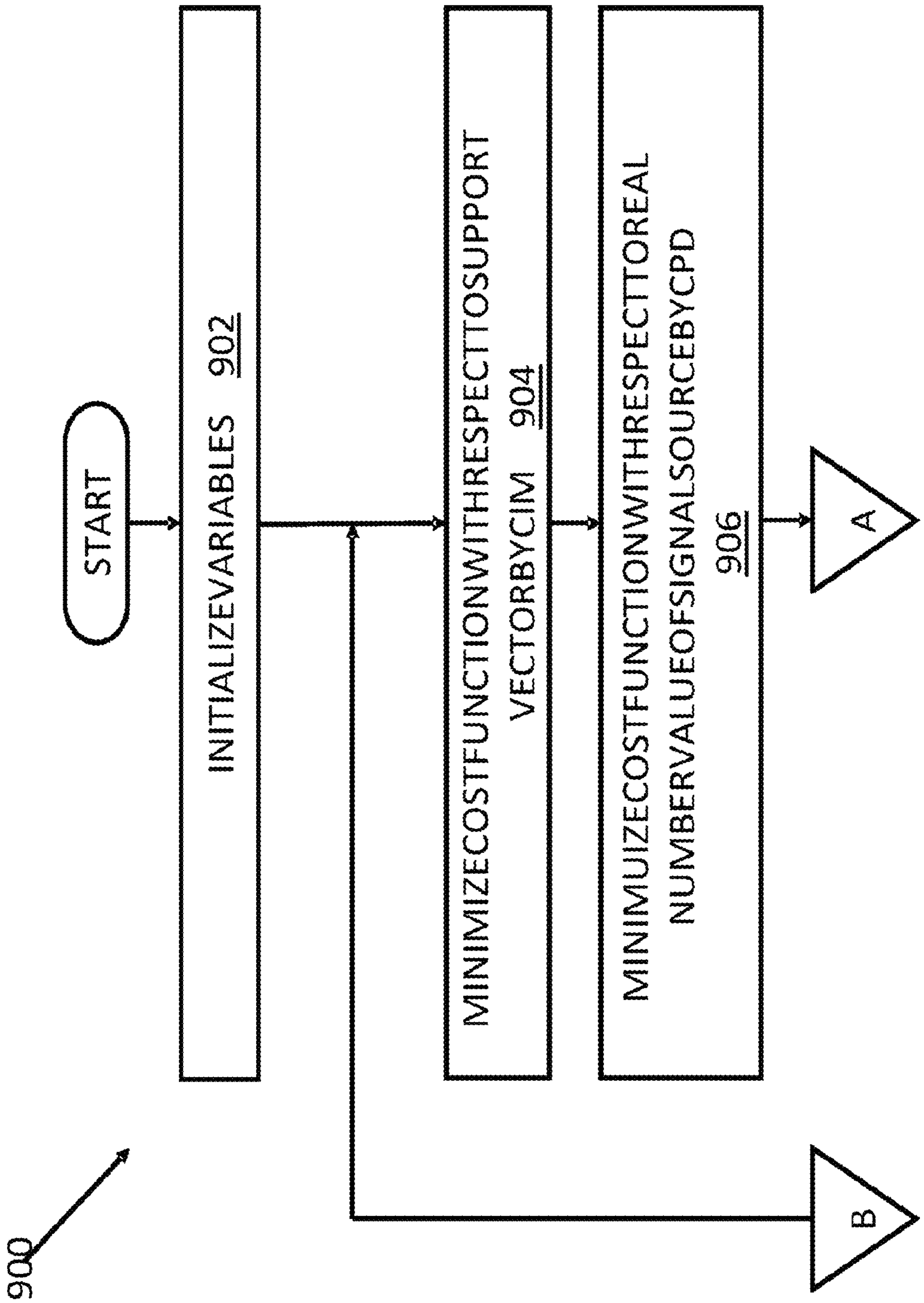
Figure 9B:
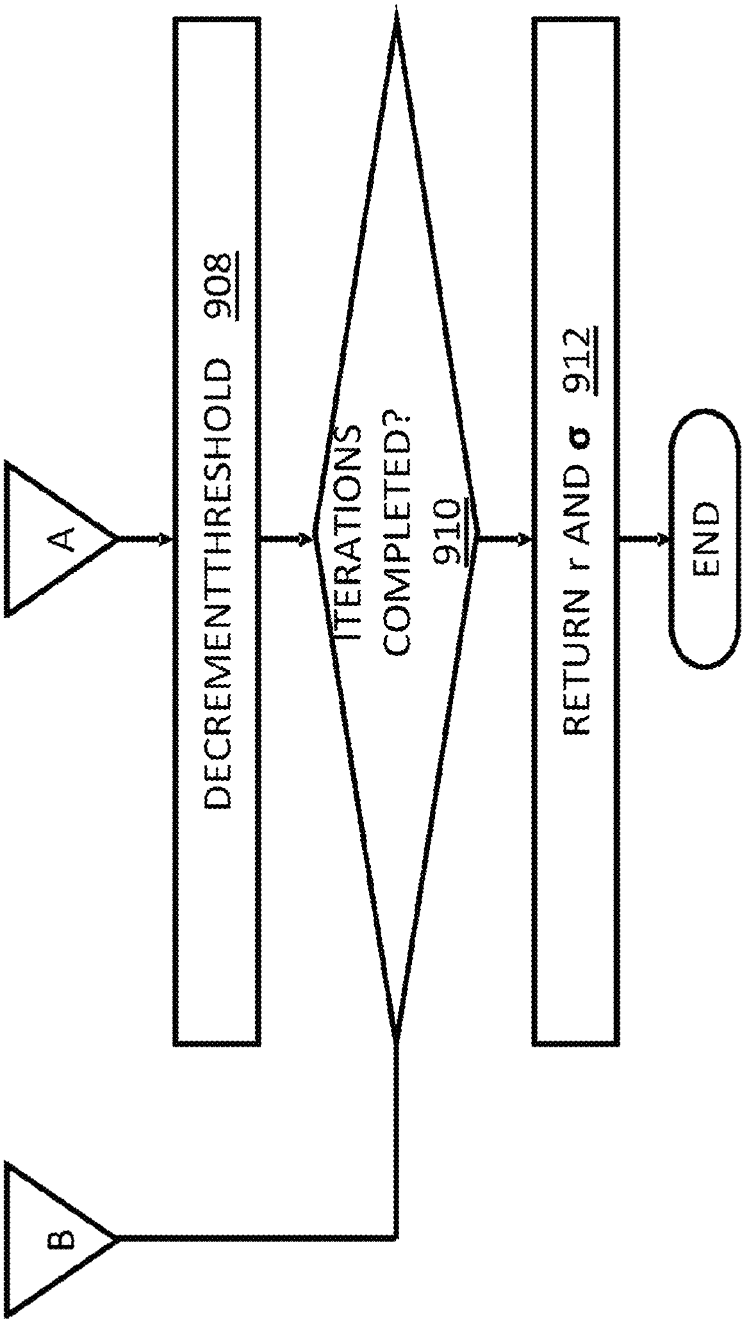

The CIM-CDP hybrid system 100 in FIG. 1B executes the L0 regularization-based CS described in Eqs. (3) and (4) above. This system achieves the optimization by alternately performing the following two minimization processes. The CIM 102 optimizes to minimize H with given r, and then forwards to the CDP 104. The CDP 104 optimizes r to minimize H with given σ, and then forwards r to the CIM 102. FIGS. 9A,9B and 10 discussed in more detail below illustrate the details of the method using two alternating minimization processes. In the method 900 shown in FIGS. 9A,9B and 10, to make the basin of attraction wider, a heuristically linear threshold reduction is introduced whereby the threshold η is linearly lowered from $\eta_{init}$ to $\eta_{end}$ as the alternating minimization proceeds.

The CIM 102 estimates the support vector σ, i.e. the places of the non-zero elements in the source signal. To optimize σ to minimize H (Hamiltonian/cost function) with given r, the CIM 102 uses a measurement feedback circuit to control the intensity modulator (IM) and phase modulator (PM), which produce the optical injection field to the target (i-th) OPO pulse:

$$f_i^{sig} = K(F_\chi(h_i) - \eta),\ i = 1, \ldots, N, \tag{5}$$

$$F_\chi(h) = \begin{cases} h & (\chi = +) \\ |h| & (\chi = \pm) \end{cases}.$$

where K is the gain of the feedback circuit and η is the threshold. r is related to the regularization parameter in Eqs. (3) and (4) by $\eta=\sqrt{\lambda}$ and h; is the local field explained below. The method uses two different functions $F_+(h)$ and $F_\pm(h)$ for the local field in accordance with the source signal. $F_+(h)$ is the identity function: it is used for a non-negative source signal. $F_\pm(h)$ is the absolute value function: it is used for a signed source signal.

The local field for estimating the support vector on the CIM is set as:

$$h_i = \sum_{j=1(\neq i)}^{M} \sum_{u=1}^{N} A_i^\mu A_j^\mu r_j H(X_j) + \sum_{\mu=1}^{M} A_i^\mu y^\mu \tag{6}$$

where $X_j$ is the in-phase amplitude (generalized coordinate) of the j-th OPO pulse measured by a homodyne detector. In the local field, H(X) is the Heaviside step function taking 0 for X≤0 or +1 for X>0. $r_j$ is a solution given by the CDP 104. During the support vector estimation on the CIM 102, all $r_j$ are fixed. Thus, the first term is the mutual interaction term, and the second term corresponds to the Zeeman term.

The CDP 104 obtains a solution of the linear simultaneous equations from the minimization condition of H with respect to r. Without loss of generality, the elementwise representation of the simultaneous equations with respect to the unknown values of r; can be rewritten as:

$$r_i \sum_{\mu=1}^{M} (A_i^\mu)^2 = H(X_i) h_i,\ i = 1, \ldots, N \tag{7}$$

$$h_i = -\sum_{j=1(\neq i)}^{N} \sum_{\mu=1}^{M} A_i^\mu A_j^\mu H(X_j) r_j + \sum_{\mu=1}^{M} A_i^\mu y^\mu \tag{8}$$

To eliminate indeniteness, $r_i$ is set to zero when $H(X_i)$ is zero. Here, $h_i$ in Eq. (8) is the same as the local field (Eq. (6)) for the support estimation on the CIM 102. $X_j$ is the solution given by the CIM 102. During the signal estimation on the CDP 104, all $H(X_j)$ are fixed. The solution of the simultaneous equations (Eq. (7)) is:

$$r=(\mathrm{diag}[A^TA]+SA^TAS-\mathrm{diag}[SA^TAS])^{-1}SA^Ty$$

$$S=\mathrm{diag}(H(X_1),H(X_2), \ldots ,H(X_N)).$$

Derivation of Wigner Stochastic Differential Equation for CIM

As shown in FIG. 1B, the pump pulses are injected into the main ring cavity through a second harmonic generation (SHG) crystal. A periodically poled lithium niobate (PPLN) waveguide is a highly efficient nonlinear medium for optical parametric oscillation. Suppose that the amplitude of the injected pump field into the main cavity is ϵ and the parametric coupling constant of the PPLN waveguide between the signal field and the pump field is κ. Then, the pumping Hamiltonian is:

$$\hat{\mathcal{H}}_1 = i\hbar\epsilon(\hat{a}_p^\dagger - \hat{a}_p)$$

and the parametric interaction Hamiltonian is $$\hat{\mathcal{H}}_2 = i\hbar\kappa/2(\hat{a}_s^{\dagger 2}\hat{a}_p - \hat{a}_p^\dagger\hat{a}_s^2).$$

Here $\hat{a}_p$ and $\hat{a}_s$ are the annihilation operators for the intracavity pump and signal fields. If the round-trip time of the ring cavity correctly adjusted to N times the pump pulse interval, N independent and identical OPO pulses can be simultaneously generated inside the cavity. The photon annihilation and creation operators for the j-th OPO signal pulse are denoted by $\hat{a}_j$ and $$\hat{a}_j^\dagger.$$

The intra-cavity pump field and signal field have loss rates $\gamma_p$ and $\gamma_s$, respectively. If $\gamma_p >> \gamma_s$, the pump field can be eliminated by the slaving principle: the following master equation of the density operator for a solitary j-th OPO signal pulse is obtained by adiabatic elimination of the pump mode:

$$\frac{\partial \hat{\rho}_{DOPO}}{\partial t} = -i\hbar\frac{S}{2}\sum_{j=1}^{N}\left[\hat{a}_j^{\dagger 2} - \hat{a}_j^2, \hat{\rho}_{DOPO}\right] + \gamma_s\sum_{j=1}^{N}\left(2\hat{a}_j\hat{\rho}_{DOPO}\hat{a}_j^{\dagger} - \hat{a}_j^{\dagger}\hat{a}_j\hat{\rho}_{DOPO} - \hat{\rho}_{DOPO}\hat{a}_j^{\dagger}\hat{a}_j\right) + \frac{B}{2}\sum_{j=1}^{N}\left(2\hat{a}_j^2\hat{\rho}_{DOPO}\hat{a}_j^{\dagger 2} - \hat{a}_j^{\dagger 2}\hat{a}_j^2\hat{\rho}_{DOPO} - \hat{\rho}_{DOPO}\hat{a}_j^{\dagger 2}\hat{a}_j^2\right), \tag{16*}$$

where $S=\epsilon K/\gamma_p$ and $B=\kappa^2/(2\gamma p)$ are linear parametric gain coefficient and two photon absorption (or back conversion) rate, respectively. $[\hat{x},\hat{y}]$ denotes the bosonic commutator.

The measurement-feedback circuit shown in FIG. 1B is connected to the main cavity by extraction and injection couplers with reflection coefficients $R_{ex}=j_{ex}\Delta t$ and $R_{in}=j_{in}\Delta t$ where $j_{ex}$ and $j_{in}$ are coarse-grained out-coupling and in-coupling constants and $\Delta t$ is the cavity round trip time. Under a condition in which $B/\gamma_s<<1$ and the vacuum fluctuations are incident on the open ports of the extraction and injection couplers, the measurement-feedback circuit can be described with the Gaussian quantum model. The master equation consists of the linear loss term, measurement-induced state reduction term and coherent feedback signal injection term.

The Fokker-Planck equation is derived by using the Wigner $W(\alpha)$ representation of the density operator p in master equations, and the following truncated Wigner stochastic differential equation (W-SDE) may be achieved by applying Ito's rule:

$$\frac{d\alpha_i}{dt} = -(\gamma_s + j)\alpha_i + S\alpha_i^* - B|\alpha_i|^2\alpha_i + j_{in}f_i^{sig} + \sqrt{\frac{\gamma_s}{2} + \frac{j}{2} + B|\alpha_i|^2}\, v_i, \quad i = 1, \ldots, N \tag{17*}$$

where $j=j_{ex}+j_{in}$, $\alpha_i$ is the complex Wigner amplitude, and $v_i$ is a c-number noise amplitude satisfying $$\langle v_i(t)\rangle = 0,\ \langle v_i^*(t)v_j(t')\rangle = 2\delta_{ij}\delta(t-t').$$

Then, by introducing a saturation parameter $A_s$ by $A_s=\sqrt{2\gamma_p(\gamma_s+j)/\kappa^2}$ and applying the following scale transformation:

$$\frac{\alpha_i}{A_s} = c_i + is_i,\ t(\gamma_s + j) = t',\ p = S/(\gamma_s + j) \text{ and } \frac{Kj_{in}}{A_s(\gamma_s + j)} = \tilde{K}$$

we obtain:

$$\frac{dc_i}{dt'} = \left(-1 + p - c_i^2 - s_i^2\right)c_i + \tilde{K}(F_{\chi}(h_i) - \eta) + \frac{1}{A_s}\sqrt{c_i^2 + s_i^2 + 1/2}\, W_{i,1}, \tag{18*}$$

-continued $$\frac{ds_i}{dt'} = \left(-1 - p - c_i^2 - s_i^2\right)s_i + \frac{1}{A_s}\sqrt{c_i^2 + s_i^2 + 1/2}\, W_{i,2},\ i = 1, \ldots, N,$$

where $c_i$ and $s_i$ are the in-phase and quadrature-phase normalized amplitudes of the i-th OPO pulse. The second term of the R.H.S. in the upper equation of Eq. (18*) is the optical injection field, which has only in-phase component. p is the normalized pump rate. p=1 corresponds to the oscillation threshold of a solitary OPO without mutual coupling. If p is above the oscillation threshold (p>1), each of the OPO pulses is either in the 0-phase state or $\pi$-phase state. The 0-phase of an OPO pulse is assigned to an Ising spin up-state, while the $\pi$-phase is assigned to the down-state. The last terms of both upper and lower equations of Eq. (18*) express the vacuum fluctuations injected from external reservoirs and the pump fluctuations coupled into the OPO system via gain saturation. $W_{i,1}$ and $W_{i,2}$ are independent real Gaussian noise processes satisfying $\langle W_{i,k}(t)\rangle=0$, $\langle W_{i,k}(t)W_{j,1}(t')\rangle=\delta_{ij}\delta_{kl}\delta(t-t')$. The saturation parameter $A_s$ determines the nonlinear increase (abrupt jump) of the photon number at the OPO threshold. Finally, more general quantum model of MFB-CIM without Gaussian approximation was derived for both discrete time model and continuous time model.

Macroscopic Equation for Quantum-Classical Hybrid System

To resolve the macroscopic equations for the quantum-classical hybrid system, Equation 18* above may be solved and the simultaneous equations (7) with statistical mechanics under the preconditions for applying statistical mechanics described below, the W-SDE (18*) and the simultaneous equations (7) share the same local field (Eqs. (6) and (8)), which can be rewritten by substituting the observation model (15) as:

$$h_i = -\frac{1}{M}\sum_{j=1(\neq i)}^{M}\sum_{\mu=1}^{N}A_i^{\mu}A_j^{\mu}r_jH(c_j) + \frac{1}{M}\sum_{j=1}^{M}\sum_{\mu=1}^{N}A_i^{\mu}A_j^{\mu}\xi_jx_j + \frac{1}{\sqrt{M}}\sum_{\mu=1}^{M}A_i^{\mu}n^{\mu} \tag{9}$$

where $[x_1, \ldots, x_N]^T$ is the N-dimensional source signal and $[\xi_1, \ldots, \xi_N]^T$ is the support vector. $[n_1, \ldots, n_M]^T$ is M-dimensional observation noise satisfying $\langle n^{\mu}\rangle=0$, $\langle n^{\mu}n^{\nu}\rangle=\beta^2\delta_{\mu\nu}$. $\beta^2$ is the variance of the observation noise.

Thus, the CIM 102 and CDP 104 can be unified into a single mean eld system in the steady state. Since the W-SDE for the i-th OPO only depends on the self-state and the local field $h_i$, a formal transfer function X from $h_i$ to $H(c_i)$ may be introduced:

$$H(c_i)=X(h_i).$$

Substituting the formal transfer function X into Eq. (7) and because $$\langle (A_i^{\mu})^2\rangle = 1,$$

the formal transfer function G from $h_i$ to $r_i$ is given by:

$$r_i=X(h_i)h_i=G(h_i).$$

Therefore, the local field can be defined in a self-consistent manner through the formal transfer function G as follows:

$$h_i = -\frac{1}{M}\sum_{j=1(\neq i)}^{M}\sum_{u=1}^{N} A_i^{\mu}A_j^{\mu}G(h_j) + \frac{1}{M}\sum_{j=1}^{M}\sum_{\mu=1}^{N} A_i^{\mu}A_j^{\mu}\xi_j x_j + \frac{1}{\sqrt{M}}\sum_{\mu=1}^{M} A_i^{\mu}n^{\mu} \tag{10}$$

Following a recipe of the SCSNA, the local field $h_i$ is separated into a pure local field $\tilde{h}_i$ independent of the self-state $H(c_i)r_i$ and an effective self-coupling term $\Gamma H(c_i)r_i$ (called the Onsager reaction term (ORT)) in the thermodynamic limit:

$$h_i = \tilde{h}_i + \Gamma H(c_i) r_i \tag{11}$$

$\tilde{h}_i$ and $\Gamma$ are determined in a self-consistent manner. X redefined on $\tilde{h}_i$ can be safely replaced with its average value $\langle H(c_i)\rangle$ (see Basins of Attraction section below) by using the self-averaging property of such a mean field system. Finally, the following macroscopic equation are obtained using the self-consistent local field:

$$R = \frac{1}{a}\int_{-\infty}^{+\infty} Dz\left\langle x\xi h_p \int_0^{+\infty} dc \int_{-\infty}^{+\infty} ds f(c, s|h_p)\right\rangle_{x,\xi}, \tag{12}$$

$$Q = \frac{1}{a}\int_{-\infty}^{+\infty} Dz\left\langle h_p^2 \int_0^{+\infty} dc \int_{-\infty}^{+\infty} ds f(c, s|h_p)\right\rangle_{x,\xi},$$

$$U\sqrt{\beta^2 + \frac{a}{\alpha}\left(Q + \langle x^2\rangle_x - 2R\right)} = \frac{1}{a}\int_{-\infty}^{+\infty} Dzz\left\langle h_p \int_0^{+\infty} dc \int_{-\infty}^{+\infty} ds f(c, s|h_p)\right\rangle_{x,\xi}$$

Here, R, Q and U are macroscopic parameters called the overlap, the mean square magnetization and the susceptibility, respectively. $\langle . \rangle_{x,\xi}$ denotes the average with respect to x and $\xi$ and $$f(c, s|h_y) \propto \exp\left(\frac{2A_s^2\left(c\tilde{K}(F_\chi(h_y) - \eta)V(c, s)\right)}{G_c(z, x\xi) + G_s(z, x\xi) + 0.5}\right), \ (y = m, p)$$

$$h_p = x\xi + \sqrt{\beta^2 + \frac{a}{\alpha}\left(Q + \langle x^2\rangle_x - 2R\right)}\, z, \ (c > 0)$$

$$h_m = \frac{1}{1 + \frac{a}{\alpha}U} h_p, \ (c \le 0)$$

$$V(c, s) = \frac{1}{2}(1-p)c^2 + \frac{1}{2}(1+p)s^2 + \frac{1}{2}c^2s^2 + \frac{1}{4}c^4 + \frac{1}{4}s^4.$$

$$G_c(z; x\xi) \text{ and } G_s(z; x\xi)$$

can be determined self-consistently from the following equations:

$$G_c(z, x\xi) = \int_{-\infty}^{0} dc \int_{-\infty}^{+\infty} dsc^2 f(c, s|h_m) + \int_0^{+\infty} dc \int_{-\infty}^{+\infty} dsc^2 f(c, s \mid h_p)$$

$$G_s(z, x\xi) = \int_{-\infty}^{0} dc \int_{-\infty}^{+\infty} dss^2 f(c, s|h_m) + \int_0^{+\infty} dc \int_{-\infty}^{+\infty} dss^2 f(c, s \mid h_p)$$

The saturation parameter $A_s$ (defined above) diverges in the infinite limit of the amplitude of the injected pump field $\epsilon \rightarrow +\infty$. In the limit $\lambda_s \rightarrow +\infty$, the following simplified macroscopic equation may be obtained:

$$R = \frac{1}{a}\int_{-\infty}^{+\infty} Dz\left\langle x\xi h_p \tilde{X}(h_p, h_m)\right\rangle_{x,\xi}, \tag{13}$$

$$Q = \frac{1}{a}\int_{-\infty}^{+\infty} Dz\left\langle h_p^2 \tilde{X}(h_p, h_m)\right\rangle_{x,\xi},$$

$$U\sqrt{\beta^2 + \frac{a}{\alpha}\left(Q + \langle x^2\rangle_x - 2R\right)} = \frac{1}{a}\int_{-\infty}^{+\infty} Dzz\left\langle h_p \tilde{X}(h_p, h_m)\right\rangle_{x,\xi}$$

where $\tilde{X}(h_p, h_m)$ is an effective output function obtained from the Maxwell rule, which is given by:

$$\tilde{X}(h_p, h_m) = H(F_\chi(h_p) + F_\chi(h_m) - 2\eta)$$

Accuracy of Macroscopic Equations and Comparison with LASSO when $\beta=0$

Figure 2A:
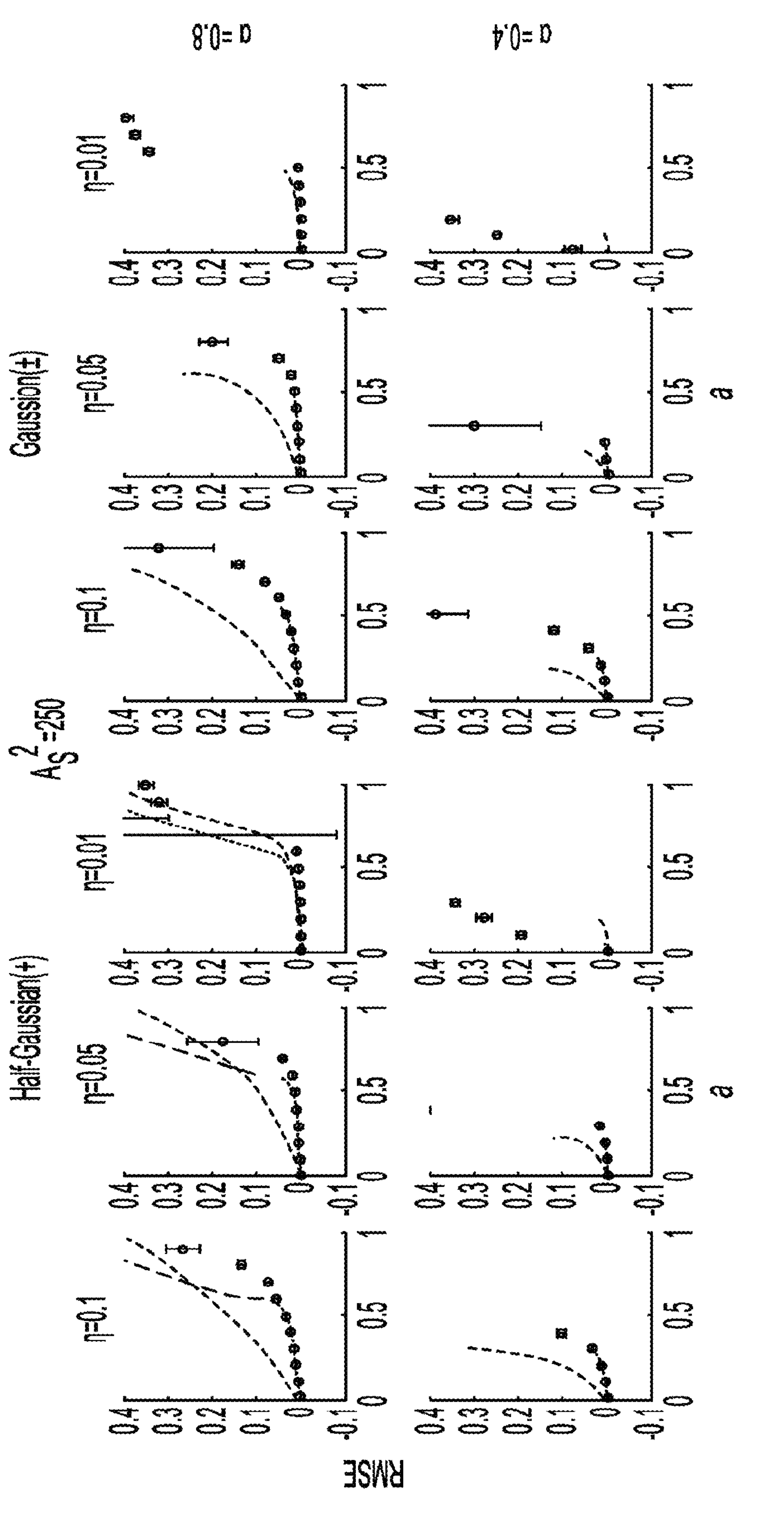
FIGS. 2*a* and 2*b* compare solutions of the method for L0 regularization-based compressed sensing.
Figure 2B:
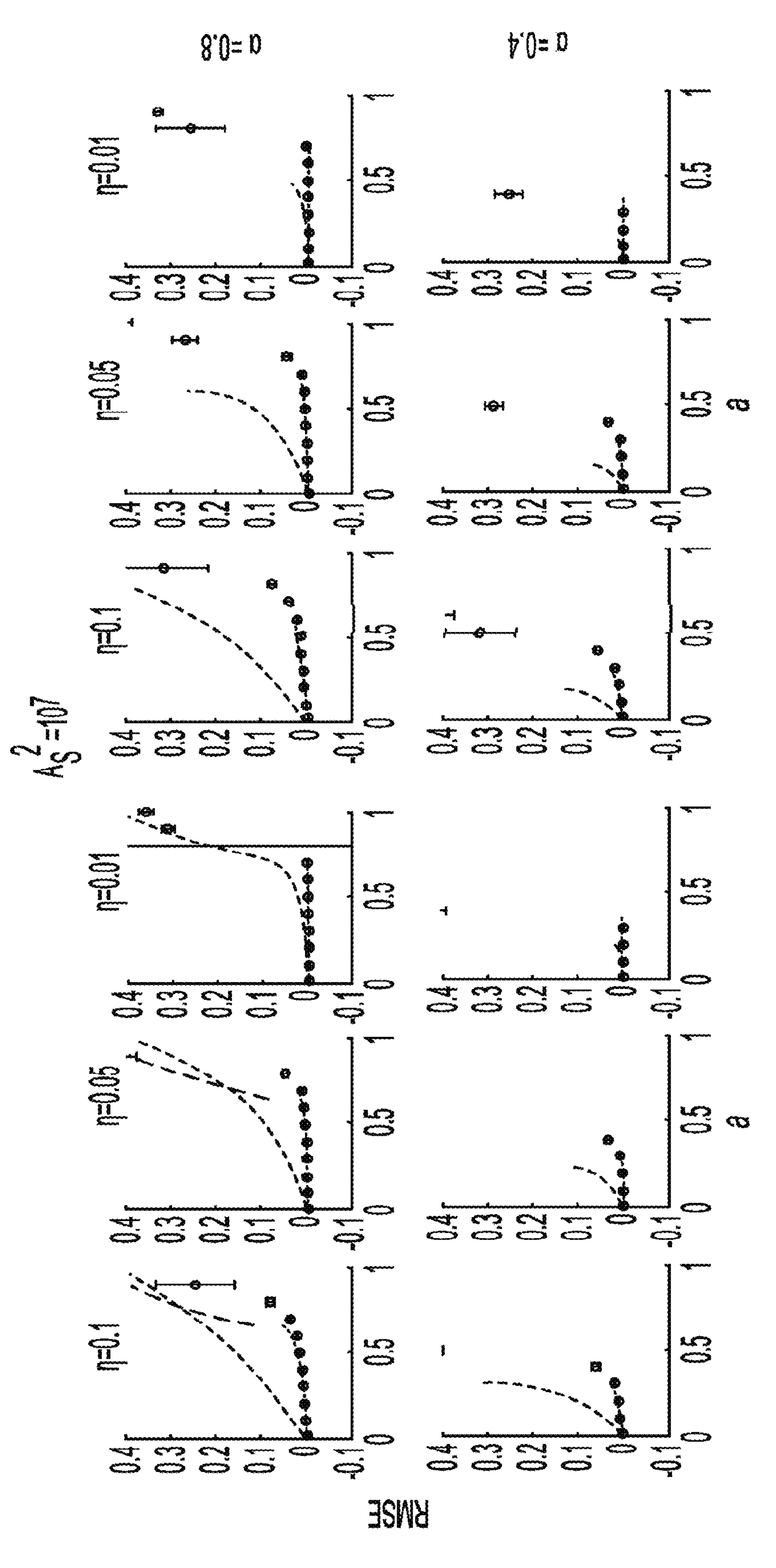

To confirm the accuracy of the macroscopic equations, the solutions above are compared to the macroscopic equation with solutions given by Algorithm 1 (FIGS. 9A-10 that are discussed below in more detail. FIGS. 2*a* and 2*b* compares solutions of the method for L0 regularization-based compressed sensing and show the root-mean-square errors (RMSEs) of the solutions to the macroscopic equation with $$A_s^2 = 250 \tag{Eq. (12)}$$

and those in the limit $$A_s^2 \Rightarrow \infty \tag{Eq. (13)}$$

for various values of the threshold $\eta$ and compression rate $\alpha$ (red and green solid lines). The figures also indicate the RMSEs of solutions obtained using Algorithm 1 with $$A_s^2 = 250 \text{ and } A_s^2 = 10^7$$

(circles with error bars). Note that $$A_s^2 = 10^7$$

is on the same order as $$A_s^2$$

in experimental real CIMs. The results in FIGS. 2*a*, 2*b* are for the case when there is no observation noise (i.e. $\beta=0$) and the source signals are from a half-Gaussian (+) or Gaussian (±). To confirm that Algorithm 1 finds solutions corresponding to the near-zero RMSE states obtained by the macroscopic equations, r was initialized as the true signal value, i.e. $x \circ \xi$, in the alternating minimization process described above. However, even in this situation, the c-amplitude was always initialized as c=0 in the initial stage of the support estimation in the alternating minimization process.

In the case of the half-Gaussian (+), two macroscopic states with non-zero RMSE (red solid lines) and near-zero RMSE (green solid lines) coexist as in a CIM-implemented CDMA multiuser detector. On the other hand, in the case of the Gaussian (±), a single macroscopic state with near-zero RMSE (red solid lines) was found. Compared with the simulation results in FIG. 2*b*, the theoretical results obtained with the macroscopic equation (13) were in good agreement with the results of Algorithm 1 with $$A_s^2 = 10^7.$$

In both the half-Gaussian case (+) and Gaussian case (±), the near-zero-RMSE states of the macroscopic equation (13) (red solid lines in FIG. 2*b*) matched those of Algorithm 1 with $$A_s^2 = 10^7$$

(circles with error bars in FIG. 2*b*), and the phase transition points given by the macroscopic equation (13) coincided with those of Algorithm 1. Under these conditions, as η was lowered to 0.01, RMSE decreased monotonically and the phase transition point ac from the near-zero-RMSE state grew monotonically. On the other hand, the theoretical results obtained from the macroscopic equation (12) with $$A_s^2 = 250$$

(red solid lines on the left of FIG. 2*a*) were in good agreement with results of Algorithm 1 with $$A_s^2 = 250$$

(circles with error bars on the left of FIG. 2*a*) in the half-Gaussian case (+), whereas the phase transition points given by the macroscopic equation (12) became lower than those of Algorithm 1 as η became smaller in the Gaussian case (±), as shown on the right of FIG. 2*a*.

Furthermore, to compare the abilities of CIM L0-regularization-based CS and LASSO, the RMSE profiles of LASSO using the macroscopic equation (37) with the same threshold value as CIM L0-regularization-based CS were computed and these profiles are superimposed upon FIG. 2 (blue solid lines). The RMSEs of CIM L0-regularization-based CS in the limit $$A_s^2 \Rightarrow \infty$$

(red solid lines in FIG. 2*b*) were lower than those of LASSO (blue solid lines) at the same compression rate a and sparseness a, and the first-order phase transition points of CIM L0-regularization-based CS were higher than those of LASSO. On the other hand, the RMSEs of CIM L0-regularization-based CS with $$A_s^2 = 250$$

(red solid lines and circles with error bars in FIG. 2*a*) were lower than those of LASSO (blue solid lines) when η=0.1 and 0.05, but the RMSEs of CIM L0-regularization-based CS became higher than those of LASSO when η=0.01.

Phase Diagrams of CIM L0-Regularization-Based CS and LASSO when β=0

Phase diagrams of CIM L0-regularization-based CS for various values of the threshold η were prepared when there was no observation noise (i.e. βi=0). FIG. 3*a* show first-order phase transition lines from the near-zero-RMSE state (red lines) in the half-Gaussian case (+) and Gaussian case (±). The phase transition lines in FIG. 3*a* are for the limit $$A_s^2 \Rightarrow \infty.$$

Figure 3:
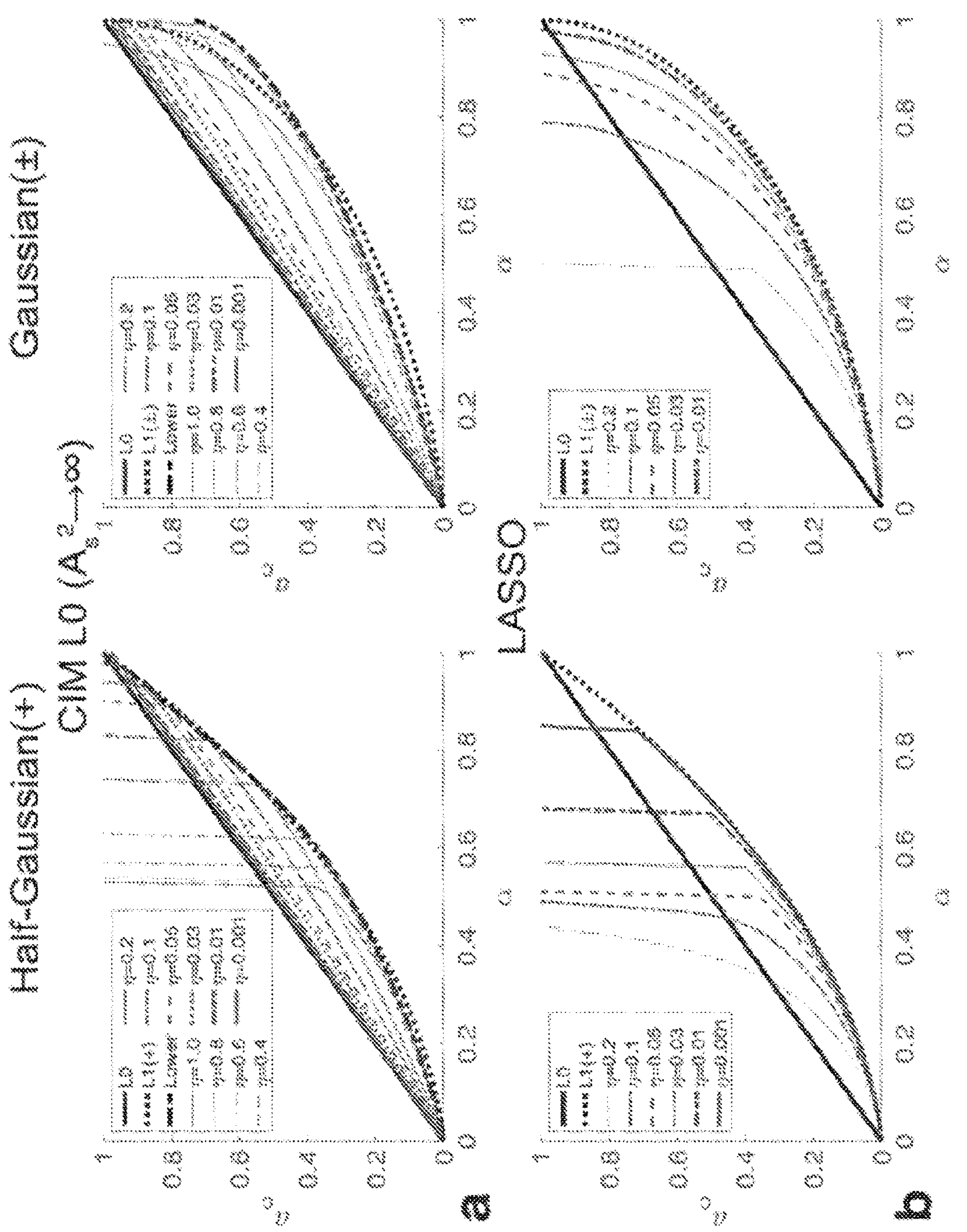
FIG. 3 are phase diagrams of L0 regularization-based compressed sensing and LASSO for various cases.

As demonstrated in FIG. 3*a*, in the limit $$A_s^2 \Rightarrow \infty,$$

the phase transition lines from the near-zero-RMSE state in CIM L0-regularization-based CS become asymptotic to the black solid line a=α as η decreases, while the RMSEs of the near-zero-RMSE state in CIM L0-regularization-based CS decrease to zero (the red lines in FIG. 2*b*). The black solid line a=α in FIG. 3 is a critical line indicating a boundary whether or not L0-minimization-based CS can perfectly reconstruct a source signal with no error for both the non-negative case and signed case. Thus, the near-zero-RMSE solutions of CIM L0-regularization-based CS are asymptotic to the perfect reconstruction solution of L0-minimization-based CS as decreases.

To compare the properties of CIM L0-regularization-based CS with those of LASSO, FIG. 3*b* shows the phase diagrams of LASSO; the blue lines are the first-order phase transition lines from the near-zero-RMSE state for various η. As η decreases, the phase transition lines from the near-zero-RMSE state in LASSO for the half-Gaussian (+) and Gaussian (±) become asymptotic to the two black dotted lines, while the RMSEs of the near-zero-RMSE state in LASSO decrease to zero (the blue lines in FIG. 2). The black dotted lines in FIG. 3 are critical lines indicating a boundary whether or not L1-minimization-based CS can perfectly reconstruct a source signal with no error for the non-negative case and signed case, respectively. Thus, the near-zero-RMSE solutions of LASSO are asymptotic to the perfect reconstruction solution of L1-minimization-based CS as η decreases.

CIM L0-regularization-based CS and LASSO have these asymptotic properties even in the case of source signals from the Gamma (+) and bilateral Gamma (±). Note that it is theoretically proved that this asymptotic property of CIM L0-regularization-based CS is invariant to differences in the probability distributions of the source signal by applying a perturbation expansion to the macroscopic equation (13) in the limit η→+0. Thus, we have confirmed this theoretical result numerically.

On the other hand, when $$A_s^2 = 250,$$

the first-order phase transition lines of CIM L0-regularization-based CS are not asymptotic to the black solid line a=α. Around η=0.1, the phase transition line is closest to a=α.

The black dotted dashed lines in FIG. 3*a* shows the lower bounds of the first-order phase transition lines of CIM L0-regularization-based CS in the limit $$A_s^2 \Rightarrow \infty.$$

The lower bound lines are above the critical line (black dotted line) of L1-minimization-based CS when the compression rate a is low. The lower boundary property in FIG. 3*a* is satisfied even in the case of source signals from the Gamma (+) and bilateral Gamma (±). On the other hand, there are no such lower bounds when $$A_s^2 = 250.$$

Basin of Attraction when β=0

To check the practicality of CIM L0-regularization-based CS, the basin of attraction of Algorithm 1 may be verified. To make the basin wider, the method may heuristically introduced a linear threshold attenuation wherein the threshold was linearly lowered from $\eta_{init}$ to $\eta_{end}$ as the minimization process was alternated (see Algorithm 1 in FIGS. 9A-10). First, numerical experiments were carried out to verify the size of the basin of attraction for various values of the initial threshold $\eta_{init}$ for fixed $\eta_{end}$=0.01 in the case of no observation noise (i.e. β=0). As shown in FIG. 4*a*, the basin of attraction tended to be widened by selecting a higher initial threshold $\eta_{init}$ than $\eta_{end}$. As the compression rate a decreased, this tendency became more marked, especially in the Gaussian case (±).

Next, it was confirmed how well Algorithm 1 converged on the near-zero RMSE state given by the macroscopic equation (13) when starting from an initial state r=0 for various $\eta_{init}$ (FIG. 4*b*). As demonstrated in FIG. 4*b*, when the sparseness a was lower than the lower bound of the first-order phase transition points (the black dotted dashed line in FIG. 3*a*), Algorithm 1 with $\eta_{init}$=0.6 converged to the solutions (red lines) of the macroscopic equation (13), whereas it failed to converge to the solutions for other values of $\eta_{init}$. Compared with the RMSE profiles of LASSO in FIG. 4*b*, Algorithm 1 exceeded LASSO's estimation accuracy under almost all of the conditions in which LASSO has a small error.

Figure 4:
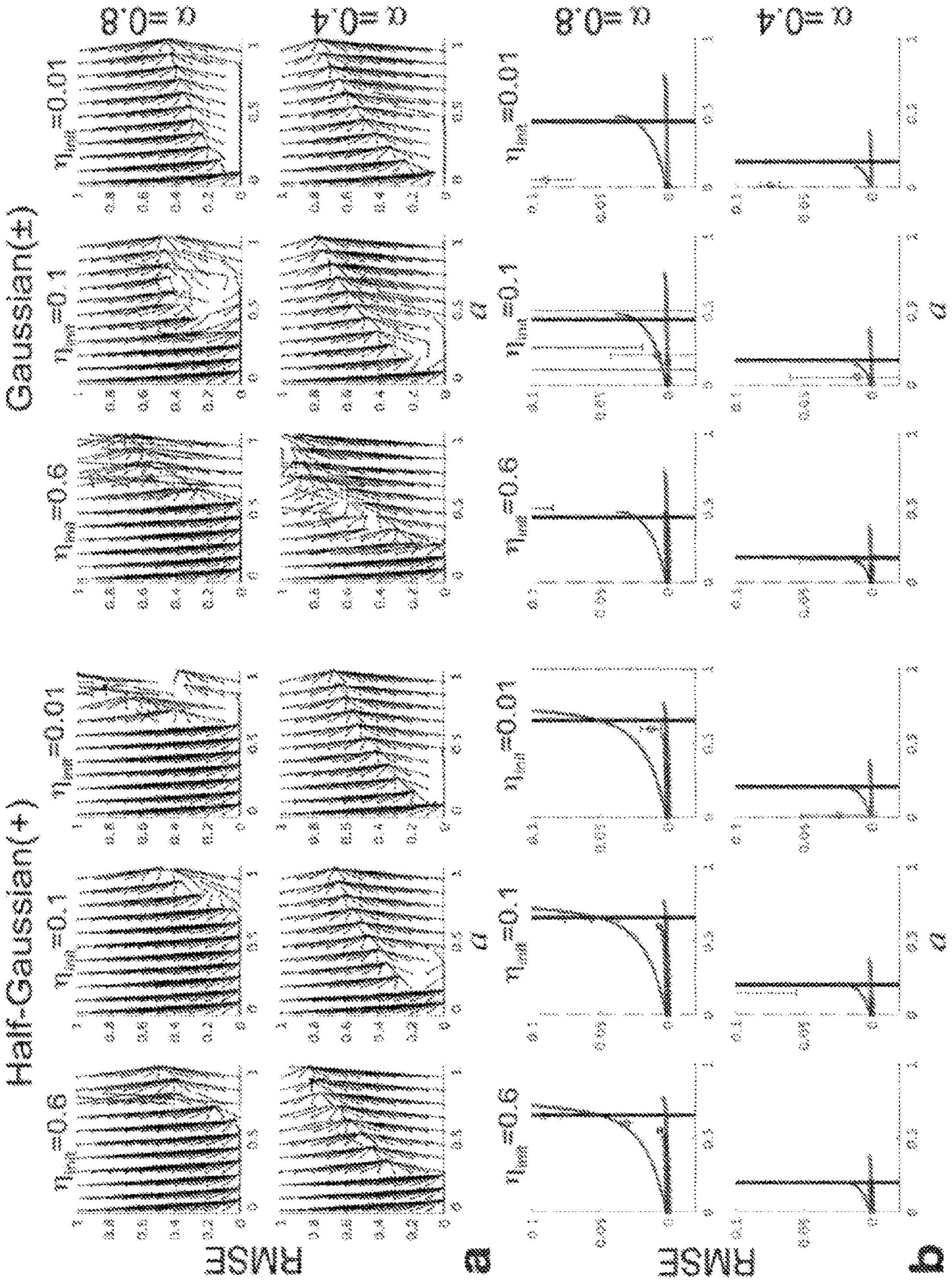
FIG. 4 shows basin of attractions for L0 regularization-based compressed sensing depending on an initial threshold.

The properties shown in FIG. 4 are satisfied even when the source signals are from the Gamma (+) and bilateral Gamma (±).

Performance of CIM L0-Regularization-Based CS and LASSO when β≠0

Moreover, to check the practicality of the CIM L0-regularization-based CS, the accuracy and convergence of the CIM L0-regularization-based CS may be verified in the presence of observation noise (i.e. β≠0). The optimal threshold values that would give the minimum RMSEs of CIM L0-regularization-based CS and those of LASSO (FIGS. 5*a* and 6*a*) were found to compute the difference between their minimum RMSEs (FIGS. 5*b* and 6*b*) under the optimal threshold for each method when β=0.01, 0.05, and 0.1. The minimum RMSE was obtained by conducting a grid search on the set of solutions to the macroscopic equations (13) and (37) in the range 0.002≤η≤0.5 at each point (a, α). These figures show cases of the half-Gaussian (+) and Gaussian (±) source signals. As indicated in FIGS. 5*a* and 6*a*, as β decreases, the phase transition lines from the-near-zero RMSE state in CIM L0-regularization-based CS under the optimal threshold approaches the critical line (black solid line) of L0-minimization-based CS, and the RMSEs of CIM L0-regularization-based CS under the optimal threshold decreases. As shown in FIGS. 5*b* and 6*b*, the RMSEs of LASSO are higher than those of CIM L0-regularization-based CS under almost all of the conditions in which LASSO has an error less than 0.2, and thus, CIM-L0-regularization-based CS exceeds LASSO's estimation accuracy under the optimal threshold for each method.

Next, for the case of observation noise, the output of Algorithm 1 was determined with $$A_s^2 = 10^7$$

converged on solutions to the macroscopic equation (13) when starting from the initial state r=0 and $\eta_{init}$=0.6. As shown in FIGS. 5*c* and 6*c*, near or at the phase transition points, Algorithm 1 converged to the solutions of the macroscopic equation (13).

Figure 5:
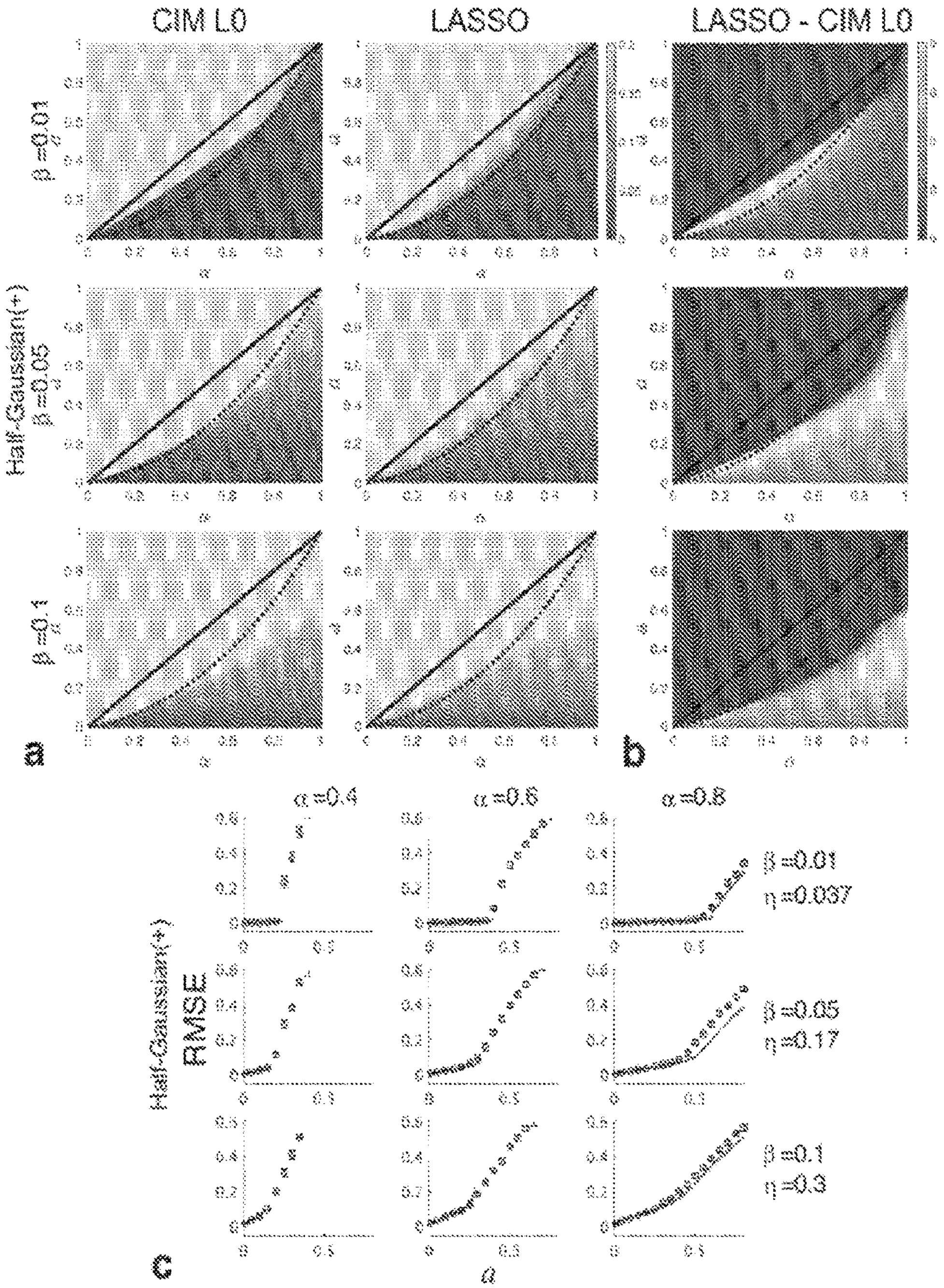
FIG. 5 shows root mean square error (RMSE) value for L0 regularization-based compressed sensing and LASSO for half-Gaussian source signals.
Figure 6:
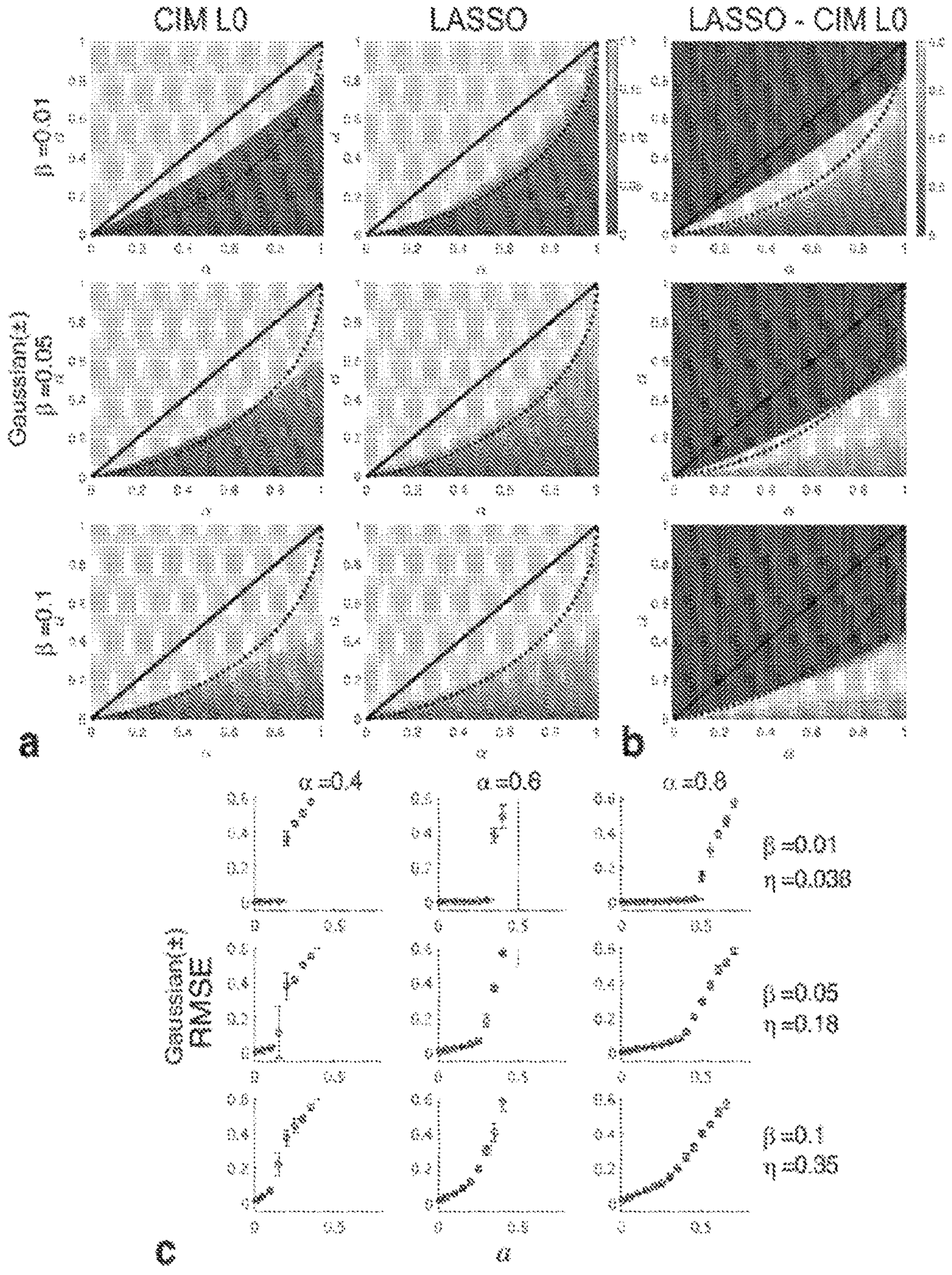
FIG. 6 shows root mean square error (RMSE) value for L0 regularization-based compressed sensing and LASSO for Gaussian source signals.

The properties shown in FIGS. 5 and 6 were similar for source signals from the Gamma (+) and bilateral Gamma (±).

Performance of CIM L0 Regularization-Based CS on Realistic Data

Figure 7A:
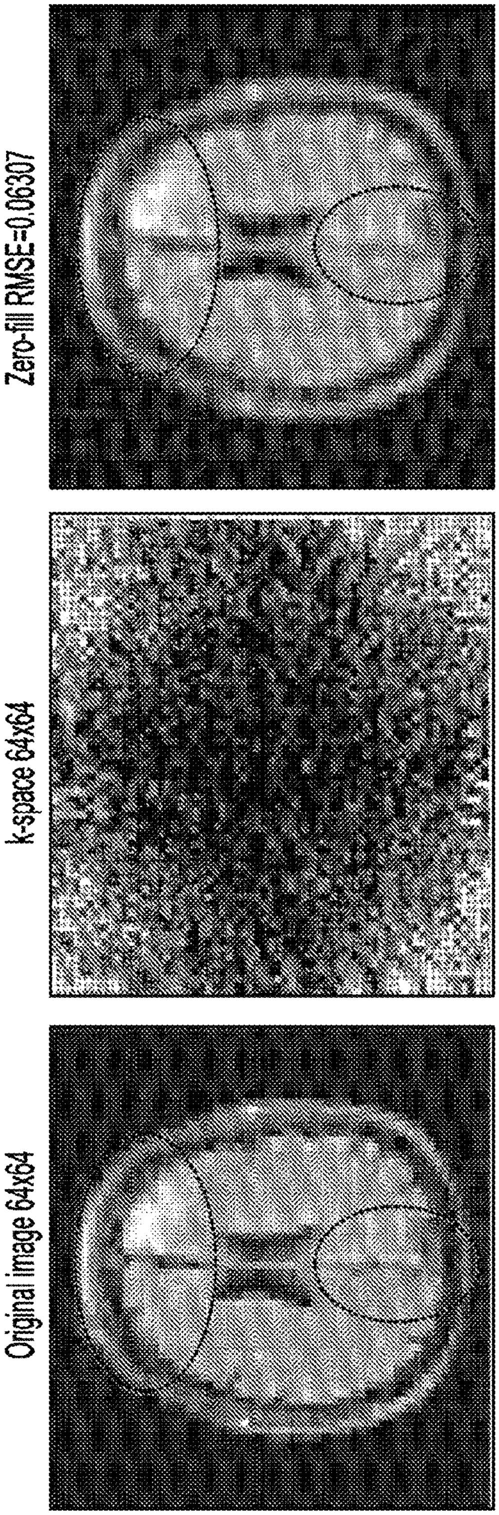
FIG. 7 illustrates the performance of L0 regularization-based compressed sensing on exemplary data.

The performance of CIM L0 regularization-based CS and other methods were evaluated on realistic data. For the evaluation, magnetic resonance imaging (MRI) data obtained from the fast MRI datasets were used. A Haar-wavelet transform (HWT) was applied to the data, and 79% of the HWT coefficients were set to zero to create a signal spanned by Haar basis functions with a sparseness of 0.21 (left panel of FIG. 7*a*). A k-space data shown in the middle panel of FIG. 7*a* was obtained by calculating the discrete Fourier transform (DFT) from the signal of the left panel of FIG. 7*a*, and 40% of k-space data were undersampled at random red points in the middle panel of FIG. 7*a* to create an observation signal with a compression rate of 0.4. The right panel of FIG. 7*a* shows an image with incoherent artifacts obtained by zero-filling Fourier reconstruction from the randomly undersampled k-space data.

To achieve higher reconstruction accuracy from the undersampled signal, an implementable optimization problem on CIM was formulated with L0 and L2 norms:

$$x = \underset{x \in \mathbb{R}^N}{\operatorname{argmin}}\left(\frac{1}{2}\|y - SFx\|_2^2 + \frac{1}{2}\gamma\|\Delta x\|_2^2 + \lambda\|\Psi x\|_0\right) \tag{14}$$

where x is a source signal, y is a k-space undersampling signal, F is a DFT matrix, S is an undersampling matrix, Ψ is a HWT matrix, Δ is a second derivative matrix, and γ and λ are regularization parameters. Under the variable transformation r=Ψx, the local field vector and the mutual interaction matrix for CIM L0 regularization-based CS can be set as:

$$h = -Jr \circ H(X) + SF\Psi^T y,$$

$$J = \Psi F^T S^T SF\Psi^T + \gamma\Psi\Delta^T\Delta\Psi^T$$

Furthermore, the performance of LASSO minimizing $$1/2\|y - SFx\|_2^2 + 1/2\gamma\|\Delta x\|_2^2 + \lambda\|\Psi x\|_1$$

and that of L1 minimization-based CS minimizing $$\|\Psi x\|_1 + \gamma\|\Delta x\|_2^2 \text{ s.t. } y = SFx$$

were evaluated.

Figure 7B:
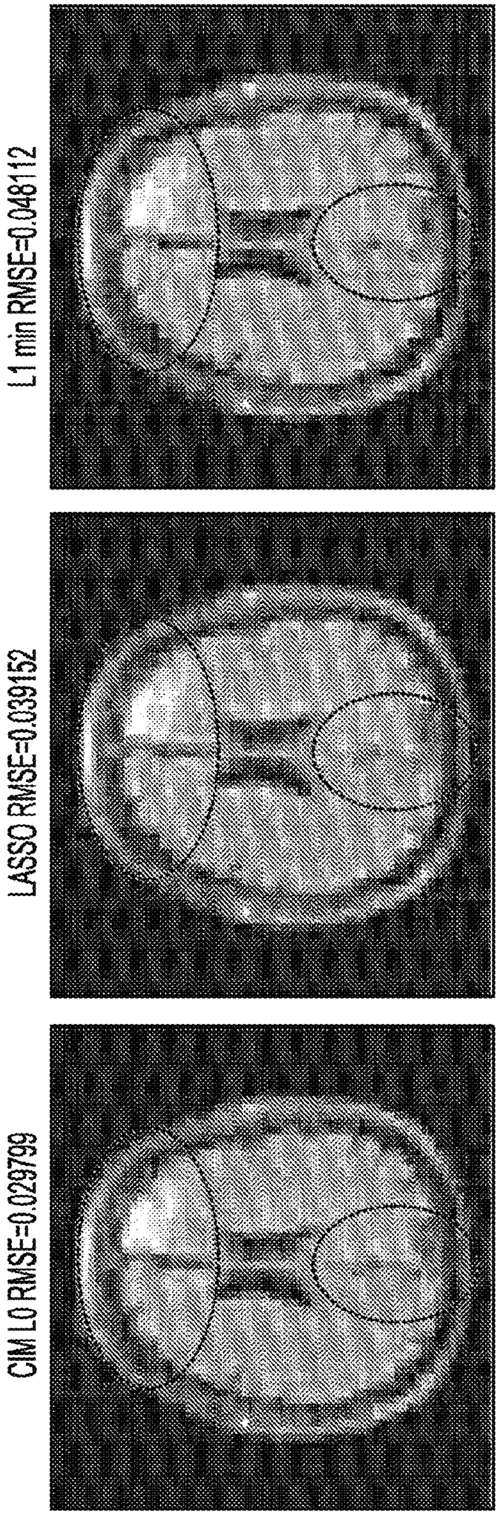

FIG. 7*b* shows images (and RMSEs) reconstructed from CIM L0 regularization-based CS (left panel of FIG. 7*b*), LASSO (middle panel of FIG. 7*b*) and L1 minimization-based CS implemented in CVX (right panel of FIG. 7*b*). As indicated in images surrounded by red circles in these panels, CIM L0 regularization-based CS gave the most accurate reconstruction.

Figure 7C:
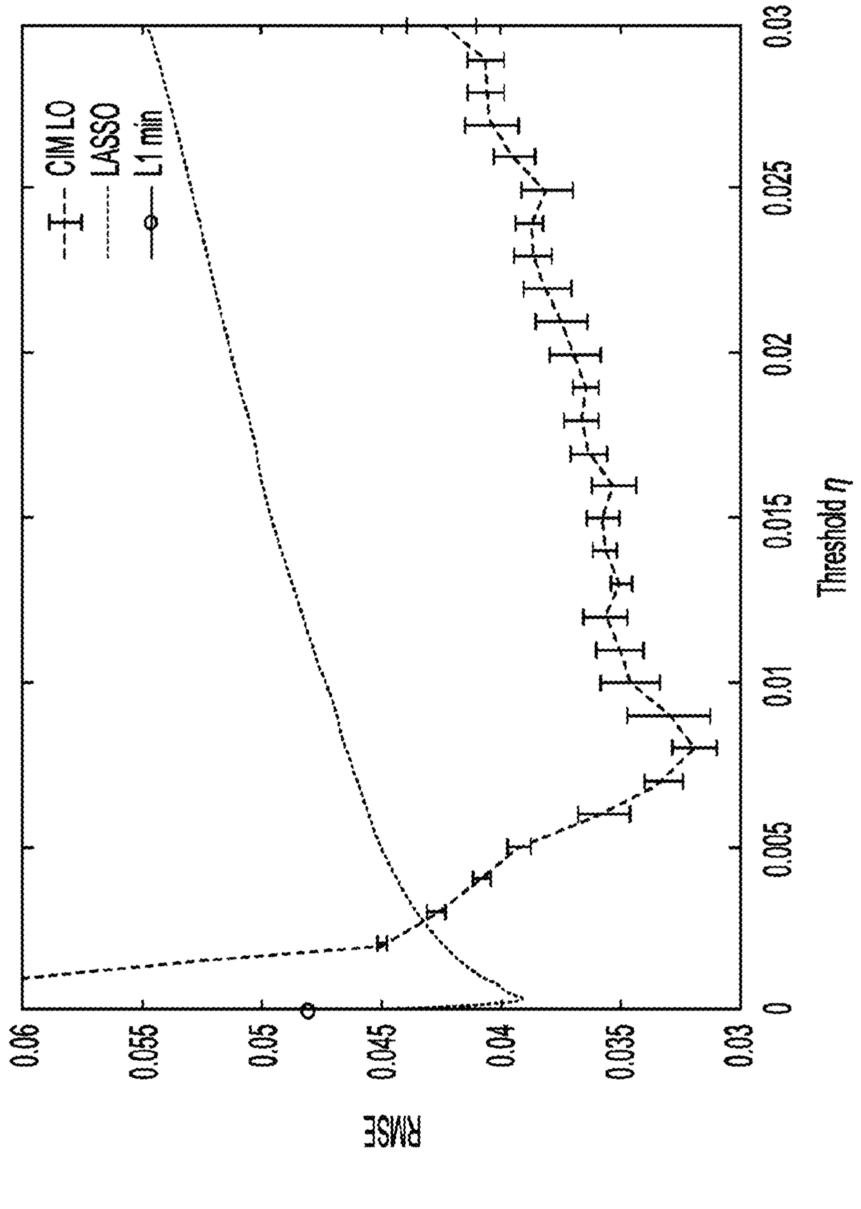
Figure 8:
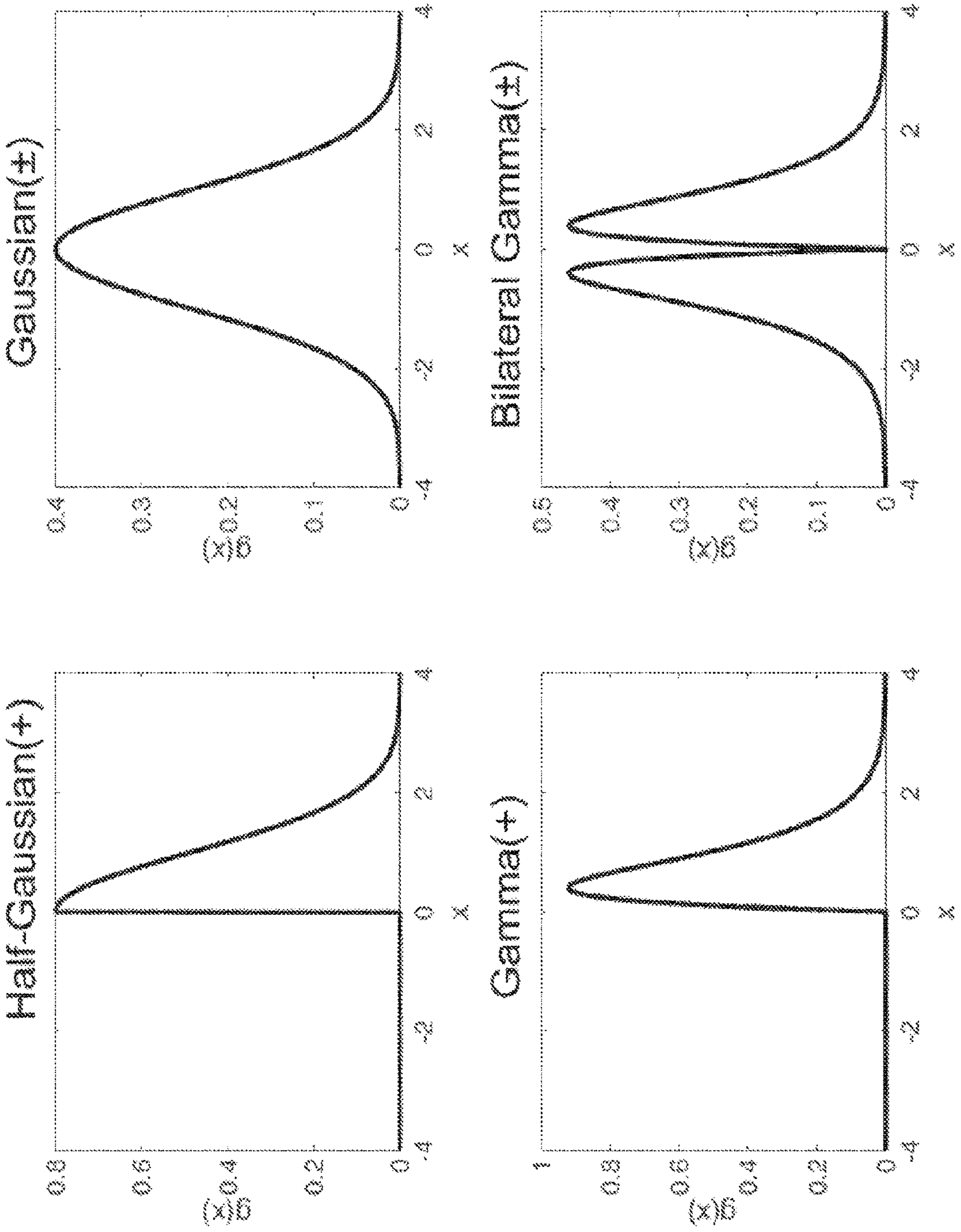
FIG. 8 illustrates four kinds of probability density functions used for generating the source signal in the numerical experiments.

The RMSEs of the three methods as a function of the threshold $\eta$ were evaluated. As shown in FIG. 7*c*, the blue line with error bars is the RMSE of CIM L0 regularization-based CS obtained from ten trials, the red line is the RMSE of LASSO, and the circle is the RMSE of L1 minimization-based CS, which is identical to LASSO in the limit $\eta \to 0$, as demonstrated in FIG. 3*c*. There is an optimal value of to minimize the RMSEs of both CIM L0 regularization-based CS and LASSO because of a trade-off between detecting small non-zero elements and eliminating incoherent artifacts by thresholding. The RMSE of CIM L0 regularization-based CS was lower than those of the other methods in a wide range of r.

FIGS. 9A-9B and 10 are a flowchart and more detailed pseudocode of a method 900 for L0 regularization-based compressed sensing. In one embodiment, the CIM and CDP shown in FIG. 1B may be used to perform the method, but other apparatus may be used. Furthermore, while the pseudocode in FIG. 10 is more details about the precise processes being performed and shows a preferred implementation of the method, the method can vary from the pseudocode of FIG. 10 and be within the scope of the disclosure. In one embodiment, the method 900 may be performed by a computer system having a processor and memory and a plurality of lines of computer code/instructions stored in the memory and executed by the processor of the computer system to perform the method 900 wherein the computer system is associated with the CIM and CDP in the system in FIG. 1B. Alternatively, the FPGAs and/or CDP in FIG. 1B may have the plurality of lines of computer code/instructions stored in the FPGAs or CDP and executed by the FPGA or CDP to implement the method 900.

As shown in FIG. 9A,the method 900 may use an M by N observation matrix A, an M-dimensional signal y, an N-dimensional support vector $\sigma$ and a N-dimensional signal vector r. The method may initialize variables (902). In one embodiment shown in FIG. 10, the variables may be r and a threshold $\eta=\eta_{init}$. As shown in the pseudocode and later in the flowchart, the method may perform a loop for decreasing thresholds q in which each loop of the loop performs two minimizations and a decrementing of the threshold $\eta$.

During the loop as shown in FIG. 9A, the method may minimize a cost function (H in the preferred embodiment shown in the pseudocode) with respect to a support vector (904). The method may use the CIM 102 to perform this minimization. As shown in the pseudocode, in a preferred embodiment, this process 904 may set $\sigma$=CIM support_estimation(r, $\eta$), initialize the c-amplitude as c=0, and numerically integrate the W-SDE while increasing normalized pump rate from 0 to 1.5 for five times photon's lifetime when $$A_s^2 = 10^7$$

or for two hundred times photon's lifetime when $$A_s^2 = 250.$$

During the loop as shown in FIG. 9A, the method may minimize a cost function (H in the preferred embodiment shown in the pseudocode) with respect to a real number value (r) of the signal source (906). The method may use the CDP 104 to perform this minimization. As shown in the pseudocode, in a preferred embodiment, this process 906 may set S=diag (a) and $r=(\mathrm{diag}[A^TA]+SA^TAS-\mathrm{diag}[SA^TAS])^{-1}SA^Ty$.

As shown in FIG. 9B, the method may decrement the threshold (q in a preferred embodiment) (908). As shown in the pseudocode, in a preferred embodiment, this process 909 may decrement $$\eta\colon \eta = \max\left(\eta_{init}\left(1-\frac{t}{50}\right), \eta_{end}\right).$$

The method may then determine if all of the iterations are completed (910). In one embodiment, the number of iterations of the loop (and the two minimizations) may be 50 as shown in FIG. 10. If there are more iterations, then the method loops back to process 904 to perform the next set of minimizations. If the process is completed (and all of the iterations are performed), then the method returns two results (912) that may be r and $\sigma$.

Effectiveness of CIM in Support Estimation

In Algorithm 1 shown in FIGS. 9A,9B and 10, the c-amplitude is always initialized as c=0 in the initial stage of the support estimation even when r is initialized to the true signal value, i.e. $x\circ\xi$. In this situation, the solutions of Algorithm 1 match the near-zero-RMSE states of the macroscopic equations very well, as demonstrated in FIG. 2 and Supplementary FIG. 1B, and hence, the simulated CIM can reconstruct the support vector up to the theoretical limit. Note that the macroscopic equation in the limit $$A_s^2 \to \infty \qquad \text{(Eq. (13))}$$

is equivalent to a macroscopic equation obtained from an Ising spin system with zero temperature. Therefore, the simulated CIM can reach the ground state to minimize H with respect to $\sigma$ when r is fixed.

Correctness of Assumptions

To derive the macroscopic equation (12), we derived an approximate value for $(H(c_1))$ of each OPO pulse by replacing the state variables in the second-order coefficient of the power of the quantum noise with average values of the state variables (see Eq. (19)). As shown in FIGS. 2*b*, 5*c* and 6*c*, the macroscopic equation derived under this approximation has good accuracy at the values of $$A_s^2$$

used in the actual equipment of the CIM. However, as shown in FIG. 2*a*, some solutions of the macroscopic equation did not match the numerical solutions of Algorithm 1 for smaller values of $$A_s^2.$$

Thus, this approximation is possible if the mutual injection field is much larger than the noise in the steady state where the c-amplitude has grown.

Basin of Attraction and its Dependency on Threshold

To make the basin of attraction of Algorithm 1 wider, a linear threshold attenuation was heuristically introduced in which the threshold linearly decreases as the alternating minimization proceeds. We confirmed that the basin of attraction widens as a result of lowering from a higher initial threshold $\eta_{init}$ to a lower terminal threshold $\eta_{end}$ (see FIG. 4).

According to the definition of the injection field for each OPO pulse in Eq. (5), the threshold $\eta$ acts as an external field to give a negative bias for the OPO pulses to take the down state. By initially giving a large negative external field, almost all of the OPO pulses take the n-phase state, and thus, almost all of the $\{H(X_j)\}_{j=1, \ldots, N}$ take zero in the initial stage of the alternating minimization process. In the initial stage, the system can easily reach the ground state under a strong negative bias because the phase space, which consists of a small number of up-state OPO pulses, is simple. Then, through the alternating minimization process, the system tracks gradual changes in the ground state due to incremental increases in the number of up-state OPO pulses by gradually sweeping out a negative external field. Finally, the system achieves the ground state at the terminal threshold $\eta_{end}$. This is the qualitative interpretation of the mechanism of widening the basin of attraction of Algorithm 1 by linearly lowering the threshold.

However, as demonstrated in FIG. 4*b*, when there is no observation noise, the system failed to converge to the near-zero-RMSE solutions beyond the lower bound line of the first-order phase transition points. There might be many quasi steady states at the condition beyond the lower bound line as in the spin-glass phase, and thus, the system might become trapped in one of the quasi steady states.

On the other hand, when there is observation noise, as demonstrated in FIGS. 5*c* and 6*c*, the system converged to the near-zero-RMSE solutions even nearby the phase transition line when it started from the practical initial condition r=0. It was suggested that the symmetries of the system allow for the creation of quasi steady states. The observation noise could break the symmetries for quasi steady states.

Conclusion

The foregoing description, for purpose of explanation, has been with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include and/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, hand-held or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that perform particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general-purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software, and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

What is claimed is:

1. A hybrid system for L0 regularization-based compressed sensing of a source signal, the hybrid system comprising:

a coherent Ising machine comprising an optical parametric oscillator configured to optimize a first parameter of a source signal, the first parameter comprising a support vector maintained by the optical parametric oscillator as 0-phase state and $\pi$-phase state optical pulses and indicating places of non-zero elements in the source signal to minimize a cost function; and a classical machine configured to optimize a second parameter of the source signal, the second parameter comprising real number values in the source signal to minimize the cost function.

2. The hybrid system of claim 1, wherein:

the source signal is an N-dimensional source signal.

3. The hybrid system of claim 1, wherein the coherent Ising machine and the classical machine are configured to alternatively perform their corresponding optimizations, wherein:

when the coherent Ising machine optimizes the first parameter, the classical machine is configured to keep the second parameter constant; and when the classical machine optimizes the second parameter, the coherent Ising machine is configured to keep the first parameter constant.

4. The hybrid system of claim 1, wherein the cost function comprises a Hamiltonian cost function.

5. The hybrid system of claim 1, wherein the classical machine comprises a digital processor or a field programmable gate array.

6. The hybrid system of claim 1, wherein the source signal is a magnetic resonance imaging signal.

7. A method of L0 regularization-based compressed sensing of a source signal, the method comprising:

optimizing, by a coherent Ising machine comprising an optical parametric oscillator, a first parameter of a source signal, the first parameter comprising a support vector maintained by the optical parametric oscillator as 0-phase state and π-phase state optical pulses and indicating places of non-zero elements in the source signal to minimize a cost function; and optimizing, by a classical machine, a second parameter of the source signal, the second parameter comprising real number values in the source signal to minimize the cost function.

8. The method of claim 7, wherein:

the source signal is an N-dimensional source signal.

9. The method of claim 7, wherein the coherent Ising machine and the classical machine alternatively perform their corresponding optimizations, wherein:

when the coherent Ising machine is optimizing the first parameter, the classical machine keeps the second parameter constant; and when the classical machine is optimizing the second parameter, the coherent Ising machine keeps the first parameter constant.

10. The method of claim 7, wherein the cost function comprises a Hamiltonian cost function.

11. The method of claim 7, wherein the classical machine comprises a digital processor or a field programmable gate array.

12. The method of claim 7, wherein the source signal is a magnetic resonance imaging signal.

13. A method of performing an L0 regularization-based compressed sensing, the method comprising:

injecting a plurality of pump pulses into a coherent Ising machine optical parametric oscillator with an optical parametric oscillator formed in a fiber ring cavity having an output coupler and an input coupler, the output coupler in communication with a homodyne detection output and a second harmonic generation (SHG) crystal;

amplifying the plurality of pump pulses causing each of the plurality of pump pulses to take a 0-phase state or a π-phase state and model a support vector indicating places of non-zero elements in a source signal; and optimizing the support vector to minimize a cost function.

14. The method of claim 13, further comprising, picking off, by the output coupler on the fiber ring cavity, a part of each pump pulse, of the plurality of pump pulses from the fiber ring cavity; and measuring the picked off pulses using optical homodyne detectors.

15. The method of claim 14 further comprising:

calculating, by a classical digital processor or an optical delay line system, a feedback signal and providing the calculation to an intensity modulator (IM) and phase modulator (PM) thereby producing an injection field to each of a plurality of optical parametric oscillators (OPO) pulses through the input coupler on the fiber ring cavity.

16. The method of claim 15, further comprising:

generating, using a classical machine, a solution to a linear simultaneous equation and transferring the solution to the coherent Ising machine by a buffer.

17. The method of claim 16, further comprising:

providing a feedback pulse to the input coupler of the fiber ring cavity, using the solution from the classical digital processor.

* * * * *